(12) United States Patent
Fujita et al.

(10) Patent No.: US 8,847,400 B2
(45) Date of Patent: Sep. 30, 2014

(54) SEMICONDUCTOR DEVICE, METHOD FOR MANUFACTURING THE SAME, AND DATA PROCESSING DEVICE

(75) Inventors: Osamu Fujita, Tokyo (JP); Yuki Togashi, Tokyo (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 208 days.

(21) Appl. No.: 13/408,318

(22) Filed: Feb. 29, 2012

(65) Prior Publication Data

US 2012/0199984 A1 Aug. 9, 2012

Related U.S. Application Data

(63) Continuation-in-part of application No. 13/226,541, filed on Sep. 7, 2011, now Pat. No. 8,659,152.

(30) Foreign Application Priority Data

Sep. 15, 2010 (JP) .................. 2010-206858

(51) Int. Cl.
| | |
|---|---|
| H01L 23/522 | (2006.01) |
| H01L 21/768 | (2006.01) |
| H01L 23/48 | (2006.01) |
| H01L 25/065 | (2006.01) |
| H01L 21/3065 | (2006.01) |
| H01L 21/762 | (2006.01) |
| H01L 21/683 | (2006.01) |
| H01L 23/00 | (2006.01) |
| H01L 25/00 | (2006.01) |

(52) U.S. Cl.
CPC ............. *H01L 21/6835* (2013.01); *H01L 24/16* (2013.01); *H01L 2224/13025* (2013.01); *H01L 21/76898* (2013.01); *H01L 25/50* (2013.01); *H01L 24/05* (2013.01); *H01L 23/481* (2013.01); *H01L 25/0657* (2013.01); *H01L 2924/15311* (2013.01); *H01L 2924/1436* (2013.01); *H01L 2224/0557* (2013.01); *H01L 2224/13082* (2013.01); *H01L 2224/17181* (2013.01); *H01L 2221/6834* (2013.01); *H01L 2224/73104* (2013.01); *H01L 2224/11462* (2013.01); *H01L 2224/13111* (2013.01); *H01L 24/13* (2013.01); *H01L 21/30655* (2013.01); *H01L 2224/06181* (2013.01); *H01L 2225/06517* (2013.01); *H01L 2224/13009* (2013.01); *H01L 2225/06565* (2013.01); *H01L 2224/13021* (2013.01); *H01L 2924/1431* (2013.01); *H01L 24/11* (2013.01); *H01L 2225/06541* (2013.01); *H01L 21/76232* (2013.01); *H01L 2224/13147* (2013.01); *H01L 2225/06513* (2013.01); *H01L 2224/16145* (2013.01); *H01L 2224/14181* (2013.01); *H01L 24/17* (2013.01); *H01L 21/76895* (2013.01); *H01L 2224/16245* (2013.01); *H01L 24/06* (2013.01); *H01L 2224/16225* (2013.01); *H01L 24/03* (2013.01); *H01L 2224/1146* (2013.01); *H01L 2224/0401* (2013.01); *H01L 2221/68327* (2013.01); *H01L 2924/1461* (2013.01); *H01L 2225/06544* (2013.01)
USPC ........................... 257/774; 257/737; 438/700

(58) Field of Classification Search
USPC .................. 257/680, 774, E23.145, E21.577; 438/638, 700
See application file for complete search history.

(56) References Cited

U.S. PATENT DOCUMENTS 4,889,588 A * 12/1989 Fior .............................. 438/713
5,441,595 A * 8/1995 Yamagata et al. ............ 438/701

(Continued)

FOREIGN PATENT DOCUMENTS

| JP | 2007-311584 | 11/2007 |
|---|---|---|
| JP | 2009-044031 | 2/2009 |
| JP | 2009-260284 | 11/2009 |

OTHER PUBLICATIONS

United States Official Action—U.S. Appl. No. 13/226,541—Mar. 26, 2013.

Primary Examiner — Roy Potter
(74) Attorney, Agent, or Firm — Young & Thompson

(57) ABSTRACT

A semiconductor device comprises a material layer including a first surface and a trench with an opening in the first surface. The trench is formed in the material layer. The trench comprises a tapered portion and a vertical portion. The tapered portion is in contact with the opening and comprises a scalloping-forming trench. The vertical portion has a substantially vertical sidewall. A width of the scalloping-forming trench is larger than a width of the vertical portion.

20 Claims, 28 Drawing Sheets

(56) References Cited

U.S. PATENT DOCUMENTS

| | | |
|---|---|---|
| 7,646,079 B2 | 1/2010 | Umemoto |
| 2008/0272466 A1 | 11/2008 | Lake |
| 2009/0243120 A1 | 10/2009 | Kita et al. |
| 2010/0032764 A1 | 2/2010 | Andry et al. |

* cited by examiner

FIG.27
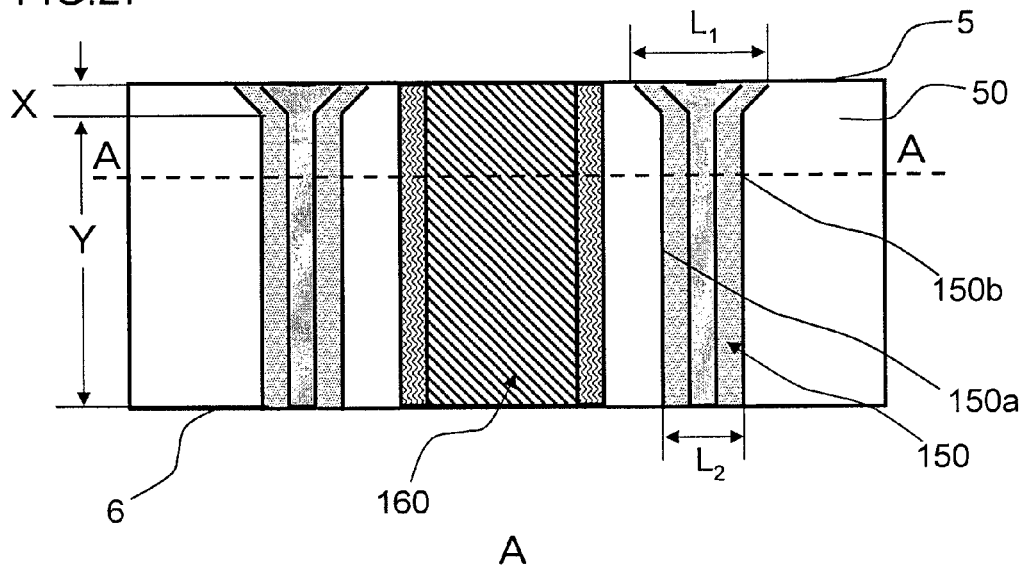
A
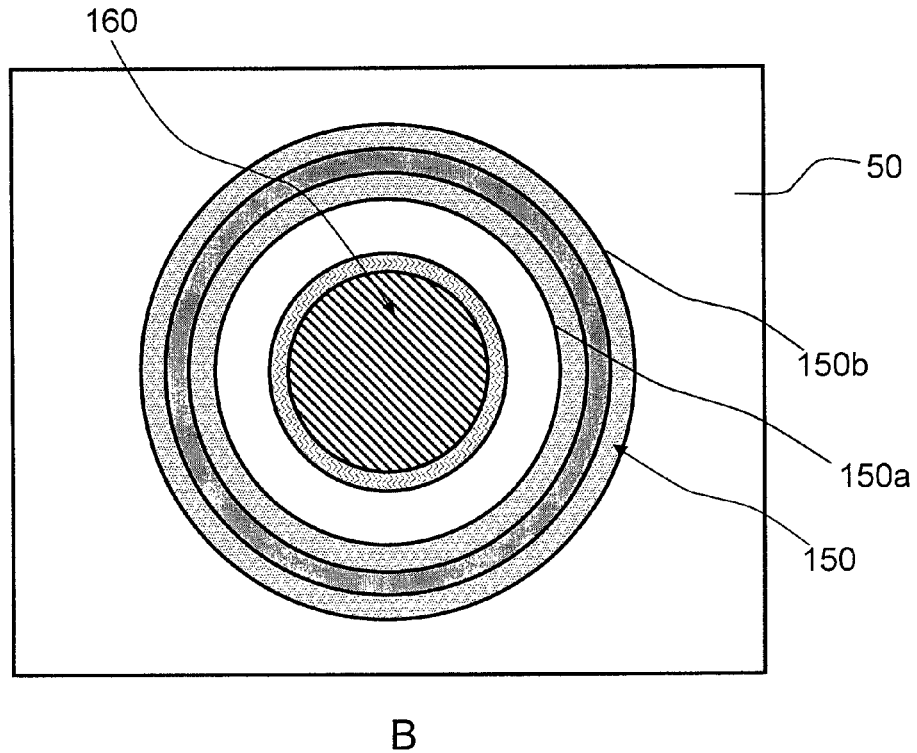
B

SEMICONDUCTOR DEVICE, METHOD FOR MANUFACTURING THE SAME, AND DATA PROCESSING DEVICE

This is a continuation-in-part of Ser. No. 13/226541, filed on Sep. 7, 2011, and based on Japanese Patent Application No. 2010-206858, filed on Sep. 15, 2010, the disclosure of which is incorporated herein in its entirety by reference.

TECHNICAL FIELD

The invention relates to a semiconductor device, a method for manufacturing the same, and a data processing device.

BACKGROUND ART

When manufacturing a semiconductor device, a process of forming an opening (via hole) has been used in many cases. As disclosed in JP 2007-311584A and JP 2009-044031A, a Bosch process has been known as a means for forming a deep opening having a vertical shape in a semiconductor substrate such as silicon. The Bosch process is a technology that repeats an etching process of isotropically etching a surface of the semiconductor substrate to form an opening and a deposition process of depositing a carbon polymer-based protective film on an inner wall of the opening alternately, thereby etching the semiconductor substrate vertically and deeply.

FIG. 23 is a sectional view of an opening 31 that is formed in a semiconductor substrate 30 by the Bosch process according to the related art. In the Bosch process, since the etching process and the deposition process are repeated, it is known that a sectional shape of a waveform referred to as scalloping (which is indicated with 'S') is formed on side surface of the opening 31.

FIG. 24 shows an opening forming method using the Bosch process according to the related art. A mask 32 having an opening pattern is formed on the semiconductor substrate 30 with a photoresist film and the like (not shown).

As shown in FIG. 24A, in a first cycle, a first opening 31-1 is formed by dry etching having high isotropy and using etching gas (first etching process).

As shown in FIG. 24B, a protective film 33 that covers an inner wall of the first opening 31-1 and a top surface of the mask 32 is deposited by using deposition gas (deposition process).

As shown in FIG. 24C, the dry etching in which the anisotropy is increased by using the etching gas is performed to remove the protective film 33 on a bottom of the first opening 31-1 (second etching process). The protective film 33a remains on side surface of the first opening 31-1.

As shown in FIG. 24D, in a second cycle, a second opening 31-2 is formed by the isotropic dry etching (first etching process). When performing the etching, a part of the protective film 33a is also removed.

By repeating the series of cycles more than once (for example, 200 times), the opening 31 having the substantially vertical shape and a predetermined depth as shown in FIG. 23 is formed.

SUMMARY OF THE INVENTION

In one embodiment, there is provided a semiconductor device, comprising:
a material layer including a first surface and a trench with an opening in the first surface, a tapered portion, and a vertical portion,
wherein the tapered portion is in contact with the opening and comprises a scalloping-forming trench; and
the vertical portion has a substantially vertical sidewall, and
wherein a width of the scalloping-forming trench is larger than a width of the vertical portion.

In another embodiment, there is provided a method for manufacturing a semiconductor device, comprising:
forming a tapered portion including a scalloping-forming trench from a first surface of a material layer inward in a thickness direction thereof; and
forming a vertical portion having a substantially vertical sidewall under the tapered portion in the material layer,
wherein a width of the scalloping-forming trench is larger than a width of the vertical portion.

In another embodiment, there is provided a data processing device, comprising:
a processor;
a DRAM memory module; and
a system bus connecting the processor with the DRAM memory module;
wherein a semiconductor device included in the data processing device comprises a material layer including a first surface and a trench with an opening in the first surface, a tapered portion, and a vertical portion,
wherein the tapered portion is in contact with the opening and comprises a scalloping-forming trench; and
the vertical portion has a substantially vertical sidewall, and
a width of the scalloping-forming trench of the tapered portion is larger than a width of the vertical portion.

BRIEF DESCRIPTION OF THE DRAWINGS

The above features and advantages of the present invention will be more apparent from the following description of certain preferred embodiments taken in conjunction with the accompanying drawings, in which:

FIG. 27 illustrates the semiconductor device of the first exemplary embodiment.

Figure 1:
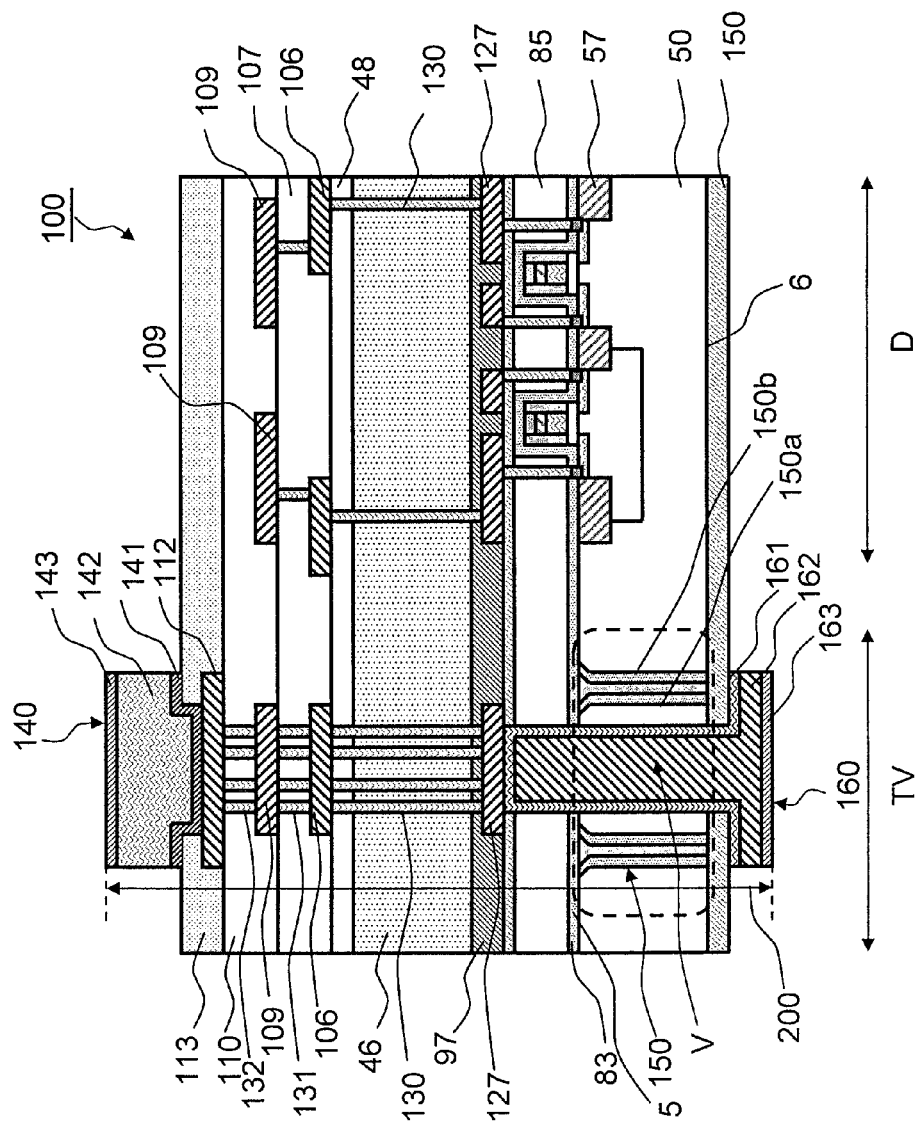
FIG. 1 shows a semiconductor device of a first exemplary embodiment.

In the drawings, reference numerals have the following meanings: 1: semiconductor substrate, 2: mask pattern, 3-1, 3-2, 3-3, 3-10: opening, 4, 4a: protective film, 5: first surface, 6: second surface, 10: insulation film, 11: thickness direction, 15: tapered portion, 16: vertical portion, 17: trench, 18: scallop-forming trench, 18a: upper edge, 18b lower edge, 18c; the outmost point on scallop-forming sidewall, 19; scallop-forming sidewall, 20; opening, 22, 31, 31-1, 31-2: opening, 30: semiconductor substrate, 32: mask pattern, 33, 33a: protective film, 35: insulation film, 36: void, 41; silicon oxide film, 42; NSG (Non-doped Silicate Glass), 43; BPSG (Boron Phosphorous Silicon Glass), 44; silicon nitride film, 50: semiconductor substrate, 51: gate insulation film, 57: isolation region, 83: liner, 85, 86, 98, 105, 107, 110: interlayer insulation film, 93: metal film, 100: semiconductor chip, 106, 109, 112: wiring, 111: silicon nitride film, 113: protective film, 114: N-type well, 120: P-type impurity diffusion layer, 121: N-type impurity diffusion layer, 124, 126: peripheral contact hole, 125: silicide layer, 127: local wiring, 130, 131, 132: contact plug, 140: topside bump, 141: seed film, 142: copper bump, 143: surface metal film, 150: insulation ring, 150a: inner side surface, 150b: outer side surface, 150c: trench for insulation ring, 151: opening (hole), 155: silicon nitride film, 160: backside bump, 161: seed film, 162: copper bump, 163: backside metal film, 200: TSV (Through Silicon Via), 321: base substrate, 322, 323, 324: semiconductor chip, 323a: backside bump, 323b: topside bump, 323c: TSV, 325: attaching film, 326: lead frame, 327: soldered ball, 328: wiring layer, 329: terminal, 330: resin, 400: printed substrate, 401: I/O terminal, 402: DRAM package, 403: control chip, 500: data processing device, 502: calculation processing device, 510: system bus, 520: calculation processing device, 530: DRAM memory module, 540: ROM (Read Only Memory), 550: non-volatile storage device, 560: I/O device, D: device region, S: scalloping, T1: tapered portion, T2: vertical portion, TV: TSV region, V: through-plug

DESCRIPTION OF PREFERRED ILLUSTRATIVE EMBODIMENTS

Figure 28:
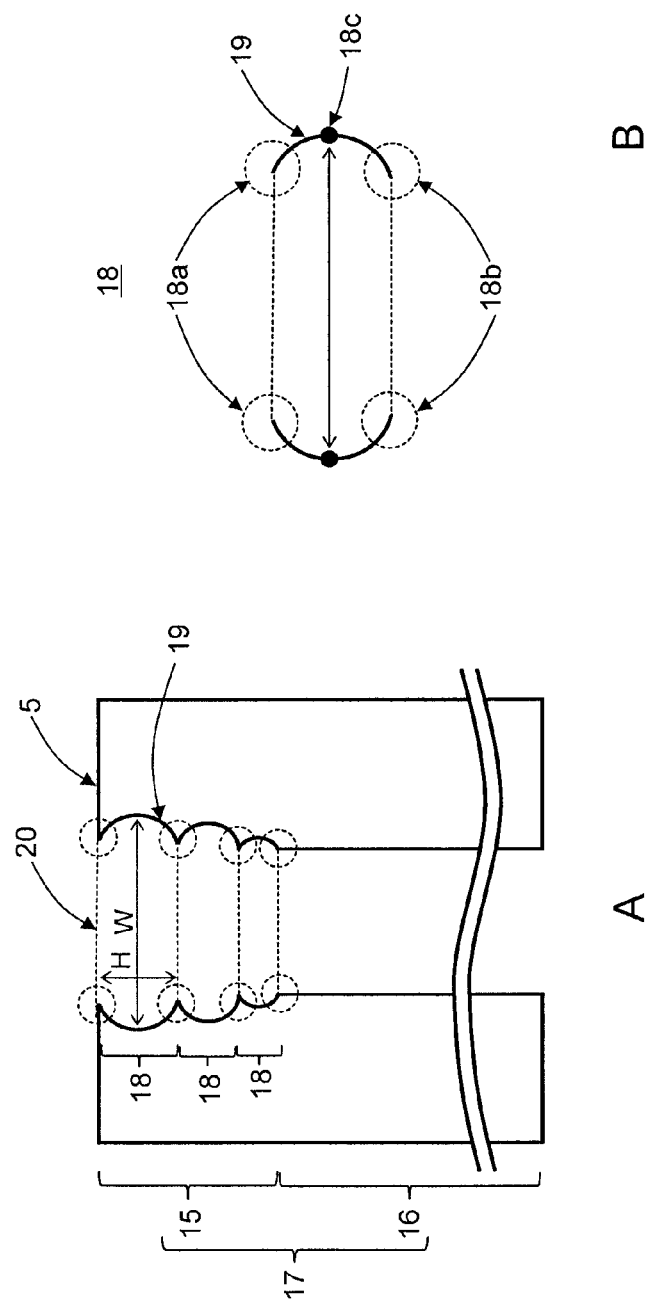
FIG. 28 illustrates one example of the semiconductor device of the present invention.

FIG. 28A is a sectional view showing a trench 17 according to the present invention, and FIG. 28B is a sectional view showing one scallop-forming trench 18. As shown in FIG. 28, the sectional view of the trench 17 according to the present invention has a shape in which a plurality of convex arcs or curved sidewalls 19 are connected with each other in a depth direction of the trench 17 and outside the trench 17. Such a wavy shape is referred to as "scallop shape", and each of convex arcs or curved sidewalls 19 outside the trench 17 is referred to as "scallop-forming sidewall". A portion of the trench 17 is positioned between one scallop-forming sidewall 19 and the other scallop-forming sidewall 19 line-symmetrical to one scallop-forming sidewall 19 with reference to a central normal of the trench 17. This portion is referred as "scallop-forming trench 18". In the scallop-forming sidewall 19 and scallop-forming trench 18, the outmost point 18c of the scallop-forming sidewall 19 is positioned between an upper edge 18a and a lower edge 18b of the scallop-forming sidewall 19. The trench 17 is composed of a plurality of the scallop-forming trenches 18 connected with each other in the depth direction of the trench 17. In addition, as shown in FIG. 28A, a height and a width of the scallop-forming trench 18 are defined as H and W, respectively. That is to say, a maximum value of a distance between the scallop-forming sidewalls 19 on a horizontal surface is defined as width, W.

The trench 17 includes a tapered portion 15 and a vertical portion 16 under the tapered portion 15. In the tapered portion 15, three scallop-forming trenches 18 are formed from an opening 20 in the depth direction so that both W and H of the scallop-forming trenches 18 gradually decrease in the depth direction. The vertical portion 16 having a substantially vertical sidewall is formed under the tapered portion 15.

First Exemplary Embodiment

A specific semiconductor device according to this present exemplary embodiment will be explained with reference to FIGS. 1 to 17. FIG. 1 is a sectional view of a semiconductor chip including a through silicon via (TSV), which is a semiconductor device of this exemplary embodiment. The semiconductor chip may include a storage device such as DRAM, SRAM, flash memory and the like and a calculation processing device such as MPU, DSP and the like.

As shown in FIG. 1, a semiconductor chip 100 comprises a device region D and a TSV region TV. In the device region D, a device such as MOS transistor is arranged, so that a predetermined circuit is configured. In the TSV region, a plurality of TSVs 200 are arranged. In FIG. 1, only one TSV 200 is shown.

The TSV 200 includes bumps (protrusion electrodes) 140 and 160 for connection at upper and lower ends. When stacking a plurality of semiconductor chips, the semiconductor chips, which are arranged above and below, are electrically connected to each other via the TSV 200. The TSV 200 includes a through-plug V penetrating the semiconductor substrate 50, a contact plug 130, 131, and 132 penetrating a plurality of interlayer insulation films 46, 48, 107, and 110 on the semiconductor substrate 50 and a wiring layer 106, 109, and 112. An insulation ring 150 is provided around a part of the TSV 200 embedded in the semiconductor substrate 50. By the insulation ring 150, the insulation among the individual TSV 200, the other TSVs and the device region D is secured.

The insulation ring 150 is formed by filling a ring-shaped opening which has a scallop-forming trench and is formed in the semiconductor substrate 50 with a silicon oxide film by using the manufacturing method of this exemplary embodiment. An end portion of the TSV 200 on a backside (a lower side of FIG. 1) of the semiconductor substrate 50 constitutes a backside bump 160. In other words, a part of the backside bump 160 penetrates through the semiconductor substrate 50.

FIG. 27A is an enlarged view of a part of the semiconductor device surrounded by the dotted line of FIG. 1 and FIG. 27B is a sectional view taken along a line A-A of FIG. 27A. In FIG. 27, the scalloping is omitted. As shown in FIG. 27, the insulation ring 150 is provided to surround a part of the backside bump 160. The insulation ring 150 is formed in a trench which comprises a tapered portion X and a vertical portion Y. The trench penetrates through the semiconductor substrate 50. The tapered portion X includes a plurality of scallop-forming trenches. The sectional are of each scallop-forming trench is gradually decreased from a first surface 5 toward a thickness direction of the semiconductor substrate 50. The vertical portion Y includes a plurality of scallop-forming trenches. The vertical portion Y has a substantially vertical sidewall. Each of the scallop-forming trenches constituting the vertical portion Y has a constant sectional area that is smaller than the minimum value of the sectional area of each of the scallop-forming trenches constituting the tapered portion X and the sectional area of the scallop-forming trenches constituting the vertical portion Y is not changed from a first surface 5 toward a thickness direction of the semiconductor substrate 50. In other words, the width of the scallop-forming trench of the tapered portion X is larger than the width of trench of the vertical portion Y. The tapered portion X comprises a plurality of scallop-forming trenches, and an opening is formed in a first surface 5. The width of the scallop-forming trench of the tapered portion X gradually decreases from the first surface 5 in a thickness direction of the semiconductor substrate 50. The width of the scallop-forming trench closer to the opening (first surface 5) is larger than the width of the scallop-forming trench farther from the opening (first surface 5). The width of the scallop-forming trench contained in the vertical portion Y also is defined as with the width of the tapered portion X. The width of each scallop-forming trench contained in the vertical portion Y is smaller than the width of any scallop-forming trench contained in the tapered portion X.

In addition, the insulation ring 150 has two side surfaces, i.e., an inner side surface 150a and an outer surface 150b surrounding the backside bump 160. In the tapered portion X, a distance $L_1$ between the two side surfaces 150a and 150b is gradually deceased from the first surface 5 toward the thickness direction of the semiconductor substrate 50. In the vertical portion Y, a distance $L_2$ between the two side surfaces 150a and 150b is constant and is not changed from the first surface 5 toward the thickness direction of the semiconductor substrate 50. In addition, the distance $L_2$ is smaller than the minimum value of the distance $L_1$ between the two side surfaces 150a and 150b of the tapered portion X.

As shown in FIG. 1, an end portion of the TSV 200 on a topside (an upper side of FIG. 1) of the semiconductor substrate 50 constitutes a topside bump 140. When stacking the plurality of semiconductor chips, the backside bump 160 is bonded with the topside bump 140 provided to the lower chip. The through plug V having integrated with the backside bump 160 penetrates through the semiconductor substrate 50 and is connected to a local wiring (local wiring layer) 127. The local wiring 127 is also provided to the device region D and is used as a part of the wiring layer configuring the circuit.

The local wiring 127 connected to the through plug V is connected to a first wiring 106 of the upper layer via first contact plugs 130. The first wiring 106 is connected to a second wiring 109 of the upper layer via second contact plugs 131. The second wiring 109 is connected to a third wiring 112 of the upper layer via third contact plugs 132. The topside bump 140 is formed so as to connect to the third wiring 112. In the meantime, although not shown, the topside bump 140 and the backside bump 160 of the TSV 200 may be connected with each other and the TSV may include an internal wiring that is electrically connected to the MOS transistor formed in the device formation region D through any one of the local wiring 127, the first wiring 106, the second wiring 109 and the third wiring 112. In addition, as required, one of the first to third contact plugs 106, 109, and 112 may be omitted to form an electrode in which the topside bump 140 and the backside bump 160 are not electrically connected therebetween. In the below, a method of manufacturing the semiconductor device including the TSV 200 will be explained.

Figure 2:
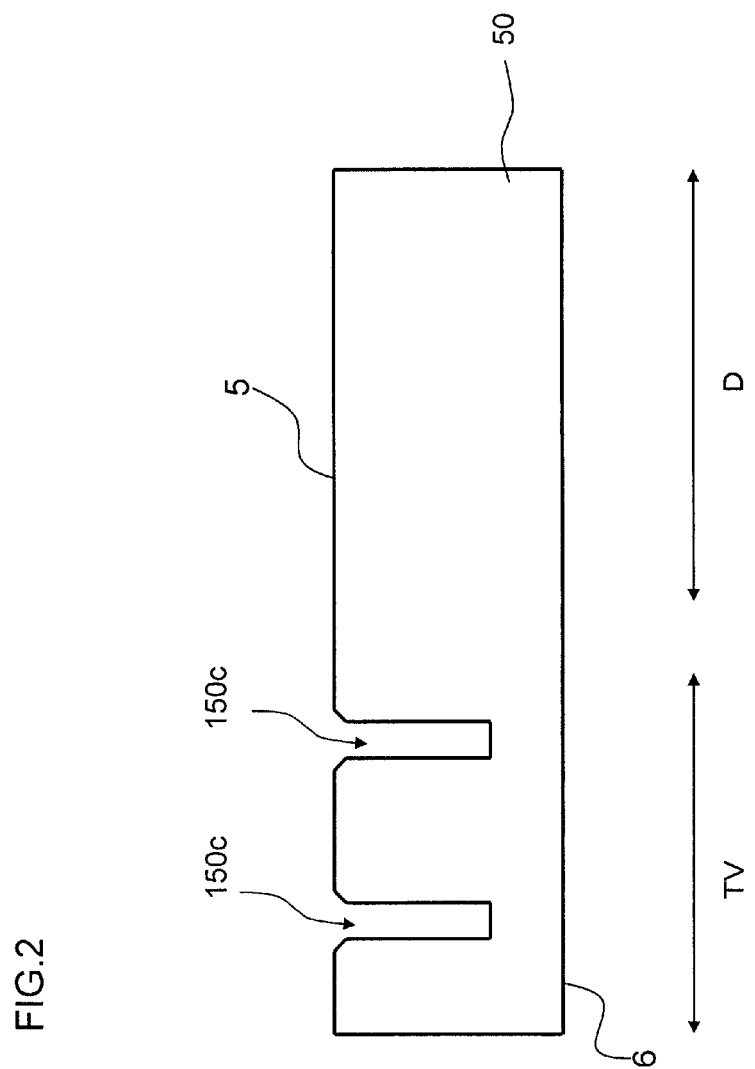
FIGS. 2 to 17 show a method of manufacturing the semiconductor device of the first exemplary embodiment.

As shown in FIG. 2, a semiconductor substrate 50 made of P-type silicon (Si) is prepared and a trench for insulation ring 150c is formed in the TSV region TV. The trench for insulation ring 150c is formed in a ring shape, when from a plan view, so as to surround the through plug V that will be formed later, and includes a opening 25 at the same height as the first surface 5. The trench for insulation ring 150c is formed so that it extends from the first surface 5 in a thickness direction of the semiconductor substrate 50. In FIG. 2, the scalloping on the side surface of the trench 150c is omitted for simplification (which is also the same as in FIGS. 10-17). In the below, a method of forming the trench for insulation ring 150c will be specifically explained with reference to FIGS. 3 to 9. In FIGS. 3 to 9, a shape of the scalloping is exaggerated for clear explanation.

Figure 3:
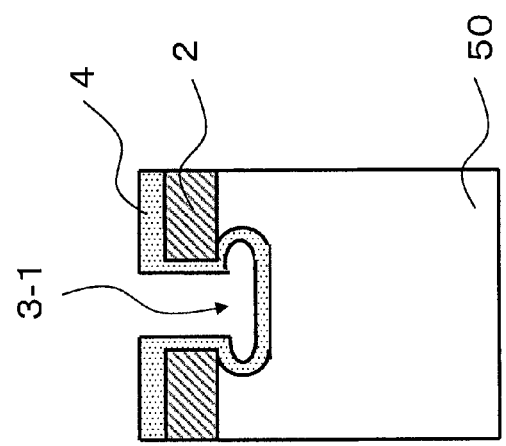

As shown in FIG. 3, a mask pattern 2 including an opening is formed on the semiconductor substrate 50 using silicon. A material of the mask pattern 2 is not particularly limited as long as it has resistance to the etching. For example, the mask pattern 2 can be formed by using a photoresist film, a silicon oxide film ($SiO_2$), a silicon nitride film ($Si_3N_4$) and the like. A scallop-forming trench is formed in a region of the semiconductor substrate 50, which is not covered by the mask pattern 2. In this exemplary embodiment, it is not necessary to beforehand form a special step shape in the mask pattern 2.

As the etching apparatus, it is possible to use a single wafer high density plasma etching apparatus of an ICP (inductively-coupled plasma) manner. As a first etching process in a first cycle, the dry etching having high isotropy is performed using $SF_6$ gas, thereby forming a scallop-forming trench 3-1 having a depth d1. The specific etching conditions may be exemplified as follows.

gas type: $SF_6$
gas flow rate: 230 to 270 sccm
pressure: 80 to 100 mTorr
source power: 2300 to 2700 W.

In this exemplary embodiment, in the first cycle, the etching time of four seconds is set, so that the scallop-forming trench 3-1 having the depth d1 of about 1 μm is formed. In the etching process, bias power is controlled separately from source power for controlling a density of the plasma, so that the energy of ions reaching the semiconductor substrate 50 is controlled to optimally set a degree of the isotropy.

In the first etching process, the bias power that is applied to the semiconductor substrate 50 is set so as to be weak (for example, 50 to 60 W) and the side etching is made. Thereby, the etching can be performed with the high isotropy.

As shown in FIG. 3, as a deposition process in the first cycle, the same etching device is used to form a protective film 4 that covers an inner wall of the scallop-forming trench 3-1. The specific deposition conditions may be exemplified as follows.

gas type: $C_4F_8$
gas flow rate: 230 to 270 sccm
pressure: 60 to 80 mTorr
source power: 2300 to 2700 W.

In the deposition process, the bias power is not applied. By the deposition process, the protective film 4, which includes, as a main component, fluoro carbon-based polymer, is formed so as to cover the inner wall of the scallop-forming trench 3-1 and a top surface of the mask pattern 2.

Figure 4:
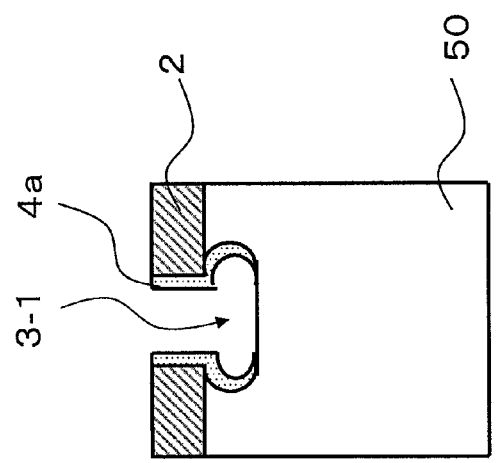

As shown in FIG. 4, as a second etching process in the first cycle, the same etching device is used to perform the dry etching having high anisotropy and using the same gas as the first etching process, so that the protective film 4 deposited on a bottom surface of the scallop-forming trench 3-1 is removed. The specific etching conditions may be exemplified as follows.

gas type: $SF_6$
gas flow rate: 230 to 270 sccm
pressure: 60 to 80 mTorr
source power: 2300 to 2700 W.

In the second etching process, the bias power that is applied to the semiconductor substrate 50 is set to be stronger (for example, 150 to 160 W) than that of the first etching process and the side etching is thus suppressed. Thereby, it is possible to perform the etching with the high anisotropy. Thus, it is possible to remove the protective film on the bottom surface of the scallop-forming trench 3-1 while the protective film 4a remains on the inner wall side surface of the scallop-forming trench 3-1.

By sequentially performing the first etching process, the deposition process and the second etching process, as described above, the first cycle of the etching process is completed.

Figure 5:
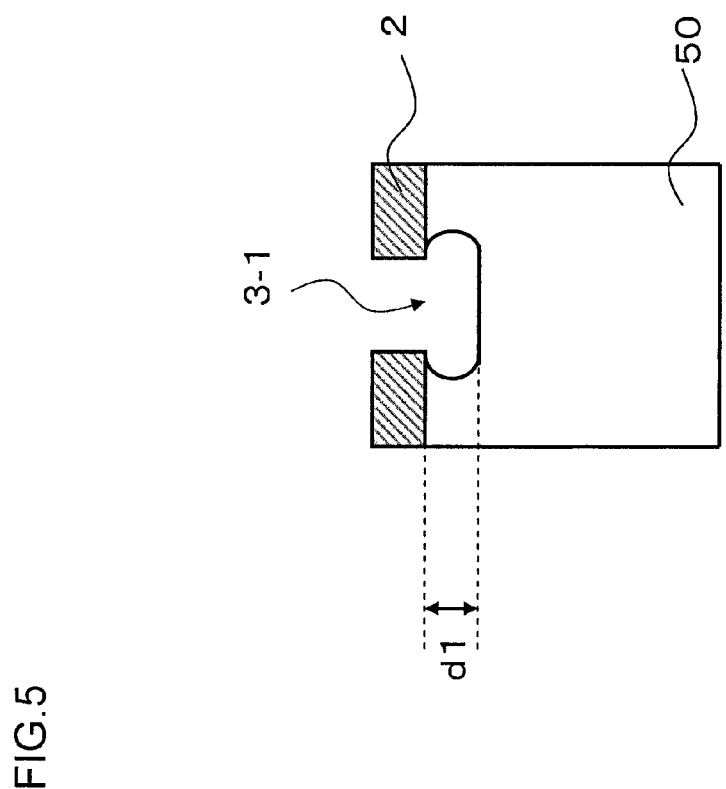
Figure 6:
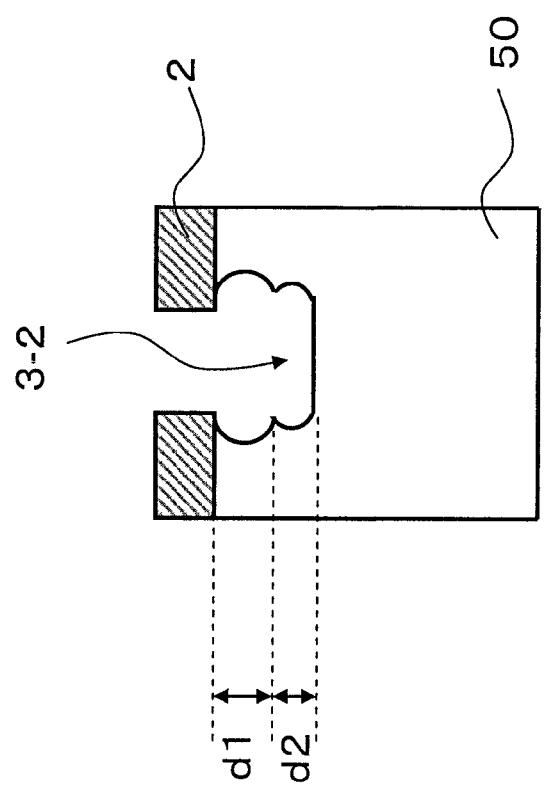

As shown in FIG. 5, at the state in which the inner wall side surface of the scallop-forming trench 3-1 are covered by the protective film 4a (in FIG. 5, the protective film 4a is not shown. The protective film 4a is not shown in the below drawings), a second cycle including the first etching process, the deposition process and the second etching process is performed, like the first cycle. At this time, the gas type, the pressure, the applying power used and the like are set to be the same as those in the respective processes of the first cycle. However, the first etching process is performed on condition that the etching time of the first etching process is shortened by predetermined time t1. In this exemplary embodiment, t1 is one second and the etching is performed for three seconds. Thereby, a scallop-forming trench 3-2 having a depth d2 of about 0.75 μm is formed.

Since the inner wall side surface of the scallop-forming trench 3-1 are covered with the protective film 4a, the side etching does not proceed. In the meantime, a part of the protective film 4a is also removed by the etching. In this exemplary embodiment, the second cycle is set so that the etching time of the first etching process is shorter by t1 than the first cycle. Thereby, the depth d2 of the scallop-forming trench 3-2 becomes shallower than the depth d1 of the scallop-forming trench 3-1 and the side etching amount of the scallop-forming trench 3-2 becomes also smaller than that of the scallop-forming trench 3-1.

Continuously, like the first cycle, the deposition process and the second etching process are sequentially performed, so that the second cycle is completed. At the completion time of the second cycle, the inner wall side surface of the scallop-forming trenches 3-1, 3-2 are covered with the protective film 4a.

Figure 7:
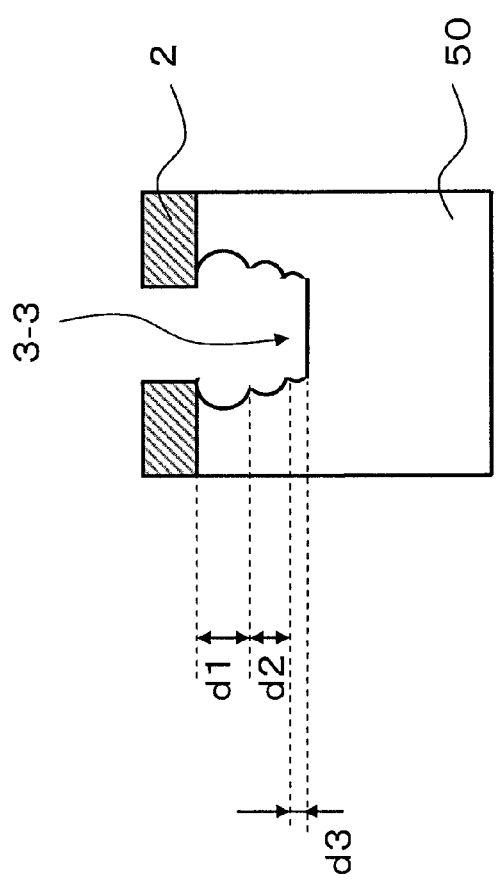

As shown in FIG. 7, at the state in which the inner walls of the scallop-forming trenches 3-1, 3-2 are covered with the protective film 4a, a third cycle including the first etching process, the deposition process and the second etching process is performed, like the second cycle. At this time, the gas type, the pressure, the applying power used and the like are set to be the same as those in the respective processes of the first cycle. However, the first etching process is performed on condition that the etching time of the first etching process is shortened by predetermined time t1, compared to the second cycle. In this exemplary embodiment, t1 is one second and the etching is performed for two seconds. Thereby, a scallop-forming trench 3-3 having a depth d3 of about 0.5 μm is formed.

Since the inner wall side surfaces of the scallop-forming trenches 3-1, 3-2 are covered with the protective film 4a, the side etching does not proceed. In this exemplary embodiment, the third cycle is set so that the etching time of the first etching process is shorter by t1 than the second cycle. Thereby, the depth d3 of the scallop-forming trench 3-3 becomes shallower than the depth d2 of the scallop-forming trench 3-2 and the side etching amount of the scallop-forming trench 3-3 becomes also smaller than that of the scallop-forming trench 3-2.

Continuously, like the second cycle, the deposition process and the second etching process are sequentially performed, so that the third cycle is completed.

By performing the first to third cycles, a tapered portion in the upper edge of the trench 150c is formed. In the specification, each trench, which is formed every one cycle in the first to third cycles, is defined as 'scallop-forming trench', and a portion of a trench 150c having a tapered shape and including the plurality of scallop-forming trenches is defined as 'tapered portion.'

Figure 8:
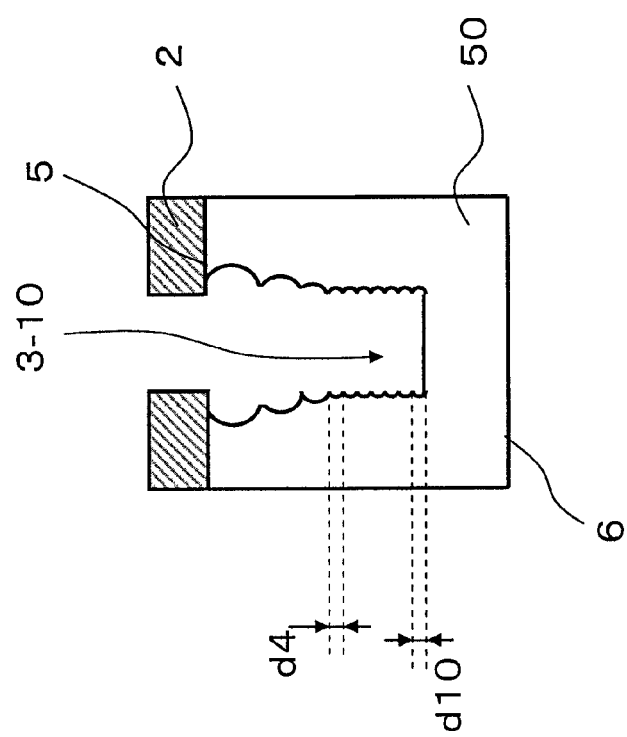

As shown in FIG. 8, in the cycles after the fourth cycle, the etching time of the first etching process is fixed with time shorter than the etching time in the first etching process of the third cycle. In this exemplary embodiment, the etching time of the first etching process is fixed with one second. By repeating the cycle several time, in which the first etching time having the fixed etching time, the deposition process and the second etching process are sequentially performed, a vertical portion having a predetermined depth is formed. In FIG. 8, it is shown that scallop-forming trenches 3-10 are formed by performing the cycle up to tenth cycle. In the specification, each trench, which is formed every one cycle in the fourth to tenth cycles, is defined as 'scallop-forming trench', and a portion of a trench 150c having substantially vertical inner wall side surface and including the plurality of scallop-forming trenches is defined as 'vertical portion'.

From the fourth cycle to the tenth cycle, the depths d4 to d10 of the scallop-forming trenches that are formed in the respective cycles are the substantially same. In addition, the side etching amount of each scallop-forming trench is also the substantially same. Thereby, in the fourth to tenth cycles, it is possible to form a trench 150c having a substantially vertical shape.

FIG. 8 shows the first to tenth cycles. However, by repeating the same cycle, it is possible to deepen a depth of the trench. After the fourth cycle, the etching time of the first etching process in which the side etching is performed is set to be shorter than the third cycle. Accordingly, a concavo-concave shape of the scalloping formed on the side surface of the scallop-forming trench becomes sufficiently small.

After the first etching process is completed in the final cycle, an ashing process may be performed by using the oxygen gas so as to remove the protective film 4a remaining in the trench 150c.

Figure 9:
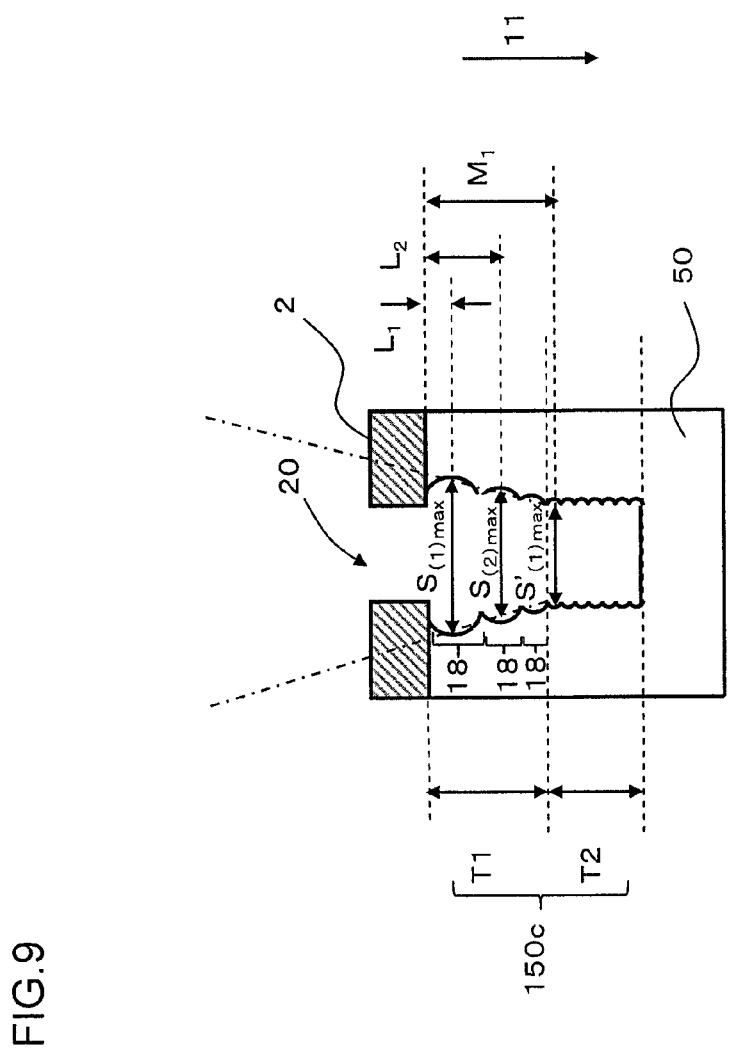

A sectional view of the trench 150c finally formed is shown in FIG. 9. In this exemplary embodiment, it is possible to form a trench 150c including a tapered portion T1 at an upper end and a vertical portion T2 except for the tapered portion T1 having a vertical shape by using the Bosch process.

In the vertical portion T2, a trench having the substantially equivalent area to an opening area of the mask pattern 2 is formed. In the tapered portion T1, an opening 20 having an area larger than an opening area of the mask pattern 2 at the uppermost end is formed. This opening 20 is positioned at the same height as the first surface 5 which is a surface of the semiconductor substrate 50.

Since each of the scallop-forming trenches 18 formed in the tapered portion T1 has the shape formed by the isotropic etching, the inner wall side surface of each scallop-forming trench 18 have a recessed shape. Accordingly, each of the scallop-forming trenches 18 has a sectional area $S_{(n)}$ (n: an integer of 1 or greater) and a length in a width direction of a section perpendicular to a thickness direction of the semiconductor substrate 50, which are changed as each of the scallop-forming trenches 18 proceed toward an inward direction 11 (a direction proceeding from the first surface 5 of the semiconductor substrate 50 to a second surface 6 that is a backside) of the semiconductor substrate 50 in the thickness direction. Also, in one scallop-forming trench 18, the sectional area $S_{(n)}$ and the length in the width direction are gradually increased as the scallop-forming trench 18 proceeds from a position closest to the first surface 5 and opening 20 along the direction 11, so that they have the maximum value at a substantially half depth of the thickness direction of the silicon substrate

50. As described above, the maximum value of the length in the width direction is defined as a width W of the scallop-forming trench 18. The sectional area $S_{(n)}$ and the length in the width direction are gradually decreased as the scallop-forming trench 18 further proceeds from the substantially half depth of the thickness direction along the direction 11. In other words, in one scallop-forming trench 18, the sectional area $S_{(n)}$ and the length in the width direction are the smallest at the position closest to the opening 20 between the position closest to the opening 20 positioned at the same height as the first surface 5 and the position of the substantially half depth of the thickness direction of the silicon substrate 50. Likewise, in one scallop-forming trench 18, the sectional area $S_{(n)}$ and the length in the width direction are the smallest at a position farthest from the opening 20 between the position of the substantially half depth of the thickness direction of the silicon substrate 50 and the position farthest from the opening 20.

Here, the sectional area of the $n^{th}$ scallop-forming trench 18 from the opening 20 toward the thickness direction 11 is indicated with $S_{(n)}$. For example, for the $1^{st}$ scallop-forming trench 18, the sectional area $S_{(1)}$ and the length in the width direction have a maximum value at a position of the depth $L_1$. Likewise, for the $2^{nd}$ scallop-forming trench 18 from the opening 20 toward the thickness direction 11, the sectional area $S_{(2)}$ and the length in the width direction have a maximum value at a position of the depth $L_2$.

By stepwise shortening the time of the first etching process of the first cycle in which the tapered portion T1 is formed, the side etching is stepwise decreased, resulting in obtaining a tapered shape, in which the sectional area and the width W of each scallop-forming trench 18 are decreased as the tapered portion T1 proceeds toward the thickness direction 11.

The tapered shape is not configured by a smooth tapered surface. As described above, since the side surface of each scallop-forming trench 18 have a recessed shape by the isotropic etching, the tapered shape is configured by a surface having a concavo-concave shape. In addition, the depth of each scallop-forming trench 18 is gradually decreased as the scallop-forming trench 18 proceeds in the inward direction 11 of the thickness direction of the semiconductor substrate 50.

Since each of the scallop-forming trenches formed in the vertical portion T2 has the shape formed by the isotropic etching, the inner wall side surface of each scallop-forming trench has a recessed shape. Accordingly, each of the scallop-forming trenches has a sectional area $S'_{(a)}$ (a: an integer of 1 or greater) and the length in the width direction of a section perpendicular to the thickness direction of the semiconductor substrate 50, which are changed as the scallop-forming trench proceeds toward the inward direction 11 of the semiconductor substrate 50 with respect to the thickness direction. Also, in one scallop-forming trench, the sectional area $S'_{(a)}$ and the length in the width direction is gradually increased as the scallop-forming trench proceeds from a position closest to the opening 20 positioned at the same height as the first surface 5 along the direction 11, so that it has the maximum value at a substantially half depth of the thickness direction of the silicon substrate 50. The sectional area $S'_{(a)}$ and the length in the width direction are gradually decreased as the scallop-forming trench further proceeds from the substantially half depth of the thickness direction along the direction 11. In other words, in one scallop-forming trench, the sectional area $S'_{(a)}$ and the length in the width direction are the smallest at the position closest to the opening 20 between the position closest to the opening 20 and the position of the substantially half depth of the thickness direction of the silicon substrate 50. Likewise, in one scallop-forming trench, the sectional area $S'_{(a)}$ and the length in the width direction are the smallest at a position farthest from the opening 20 between the position of the substantially half depth of the thickness direction of the silicon substrate 50 and the position farthest from the opening 20.

Here, the sectional area of the scallop-forming trench closest to the opening 20 regarding the thickness direction of the silicon substrate 50 is indicated with $S'_{(1)}$ and the sectional area of the $a^{th}$ scallop-forming trench as the scallop-forming trench proceeds in the thickness direction 11 is indicated with $S'_{(a)}$. For example, for the $1^{st}$ scallop-forming trench of the vertical portion T2, the sectional area $S'_{(1)}$ and the width have the maximum value at a position of the depth $M_1$ from the first surface 5 of the silicon substrate 50.

The maximum length of the vertical portion T2 in the width direction is defined as width of the vertical portion T2. If the vertical portion T2 comprises a plurality of scallop-forming trenches as the present exemplary embodiment, the maximum length of each scallop-forming trench in the width direction is defined as width of the scallop-forming trench in the vertical portion T2. Since each scallop-forming trench in the vertical portion T2 is formed under the same conditions, the sectional area and width of each scallop-forming trench is substantially the same. Therefore, width of each scallop-forming trench (the maximum length of each scallop-forming trench in the width direction) corresponds to width of the vertical portion T2. The depth of each scallop-forming trench is also the same. The vertical portion T2 is formed by forming two or more scallop-forming trenches under the same conditions.

In the above description, the scallop-forming trenches 18 of the tapered portion T1 are formed in the three-step cycles. However, the scallop-forming trenches 18 may be formed by increasing the number of cycles more than the above described process. In addition, the time that is used in the first etching process may be also arbitrarily set. In other words, in this exemplary embodiment, the etching time (time E1) of the first etching process in the first cycle is first set depending on a width of the tapered portion T1 (side etching width) to be formed. In addition, the step time t1 of decreasing the etching time is set.

Next, the etching time En of the first etching process in the $n^{th}$ cycle (n: integer of 2 or greater) is set so that En=E1−t1× (n−1), and the process is sequentially performed up to the $n^{th}$ cycle. Continuously, the cycle is performed k times (k: integer of 2 or greater), so that the first etching process is performed for the time E0 that is fixed to be shorter than the etching time En of the first etching process in the $n^{th}$ cycle that has been finally performed in the process of forming the tapered portion T1, thereby forming the vertical portion T2.

In this exemplary embodiment, the width of the upper end of the tapered portion T1 can be enlarged by performing the first cycle only one time when forming the tapered portion T1. However, it is preferable to perform the cycle of forming the tapered portion T1 at least two times (n=2 or greater) so as to improve the embedding characteristic of the insulation film and the like into the tapered portion T1. This is because when the cycle of forming the tapered portion T1 is performed only one cycle, the width of trench 105c is rapidly changed at a boundary between the tapered portion T1 and the vertical portion T2, so that an insulation film to be embedded may be easily blocked at the boundary. Since the smooth tapered shape is obtained by setting the step time t1 small and increasing the number of cycles n for forming the tapered portion T1, the improvement effect on the embedding characteristic of the insulation film is increased.

The above manufacturing conditions (gas flow rate, pressure and the like) described in the first and second etching processes and deposition process are simply exemplary and can be changed as long as it does not depart from the scope of the invention. It is easiest to control the shape of the scallop-forming trench 18 by changing the etching time of the respective cycles, as described above. However, the shape of the tapered portion T1 can be controlled by gradually changing the applying condition of the bias power in the first etching process of performing the etching having high isotropy every cycle (for example, by increasing the bias power every one cycle).

The above formation conditions of the tapered portion T1 and vertical portion T2 are exemplary and may be appropriately changed depending on the depths and widths of the tapered portion T1 and vertical portion T2. For example, it is possible to form the trench for insulation ring 150c having a depth of about 45 μm, the tapered portion T1 having a depth of about 3 to 4 μm and the vertical portion having scallop-forming trenches with a width of about 2 to 3 μm. In this case, contrary to the above conditions, by setting the initial value of the etching time E1=4 seconds and the step time t1=0.5 second and repeating the five-step cycles (n=5), it is possible to form the tapered portion T1. In addition, the vertical portion T2 is formed by repeating the cycle, in which the etching time of the first etching process E0=1 second is fixed, about 200 times.

Figure 10:
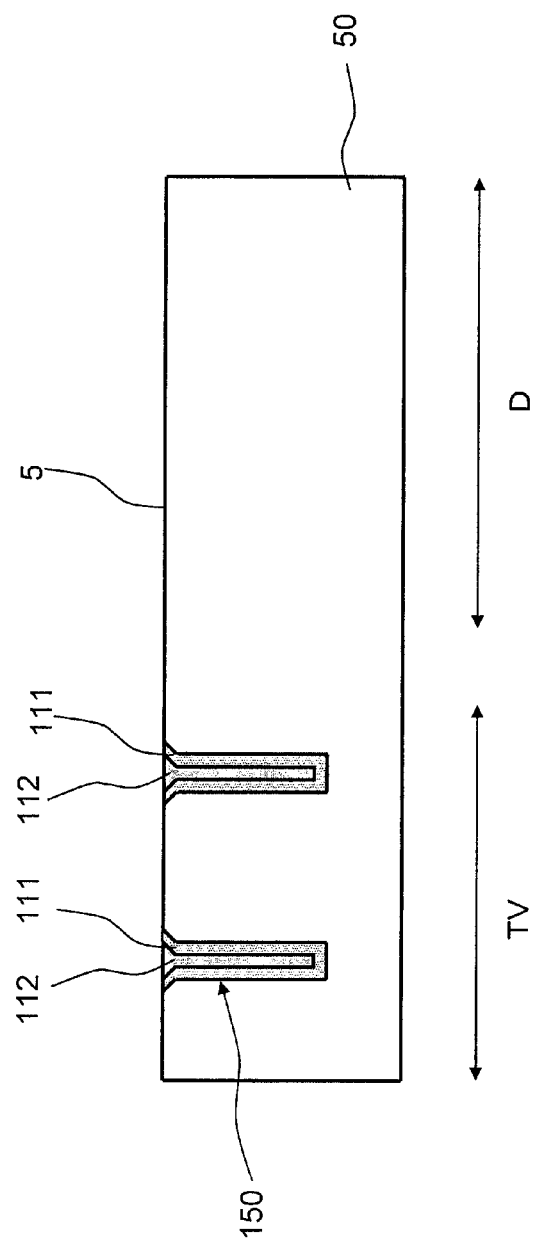

As shown in FIG. 10, a silicon nitride film 111 is formed to cover the inner wall of the trench for insulation ring 150c by a CVD method and then the trench for insulation film 150c is filled up with a silicon oxide film 112 using the CVD method. The silicon nitride film 111 and the silicon oxide film 112 on the first surface 5 of the semiconductor substrate 50 are removed by the etching so that the silicon nitride film 111 and the silicon oxide film 112 remain only in the trench for insulation ring 150c. Thereby, the insulation ring 150 is formed.

In this exemplary embodiment, the formed trench for insulation ring 150c has an aspect ratio of about 15 to 20. Accordingly, when a trench having a vertical shape is formed by the related art, it is difficult to fill the trench with the silicon oxide film 112 so that a void is not formed in the trench. To the contrary, according to this exemplary embodiment, the trench for insulation ring 150c is formed to include the tapered portion T1, to prevent a void from being formed in the trench for insulation ring 150c when filling up the trench 150c with the silicon oxide film 112. Thereby, it is possible to prevent a crack from being generated from the insulation ring 150 during the manufacturing process.

Figure 11:
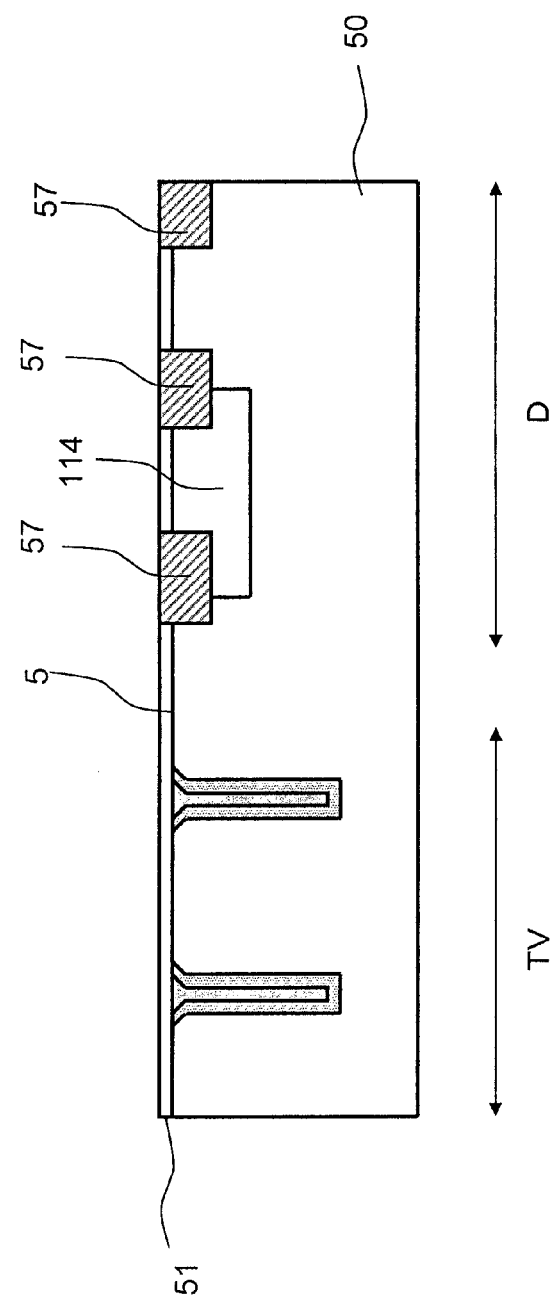

As shown in FIG. 11, in the device region D, isolation regions 57 for dividing activation areas of MOS transistors are formed by an STI method. The N-type impurities such as phosphorous are introduced into the semiconductor substrate 50 by ion implantation, to form an N-type well 114. In the N-type well 114, a P channel-type MOS transistor is disposed in a later process. Likewise, boron (B) may be ion-implanted in a region except for the N-type well 114, thereby forming a P-type well.

After the first surface 5 of the clean semiconductor substrate 50 is exposed, a gate insulation film 51 is formed on the first surface 5 of the semiconductor substrate 50 using a silicon oxide film formed by a thermal oxidation method and the like and having a film thickness of about 4 to 7 nm. As the gate insulation film 51, a high-K film (high dielectric film) may be used.

Figure 12:
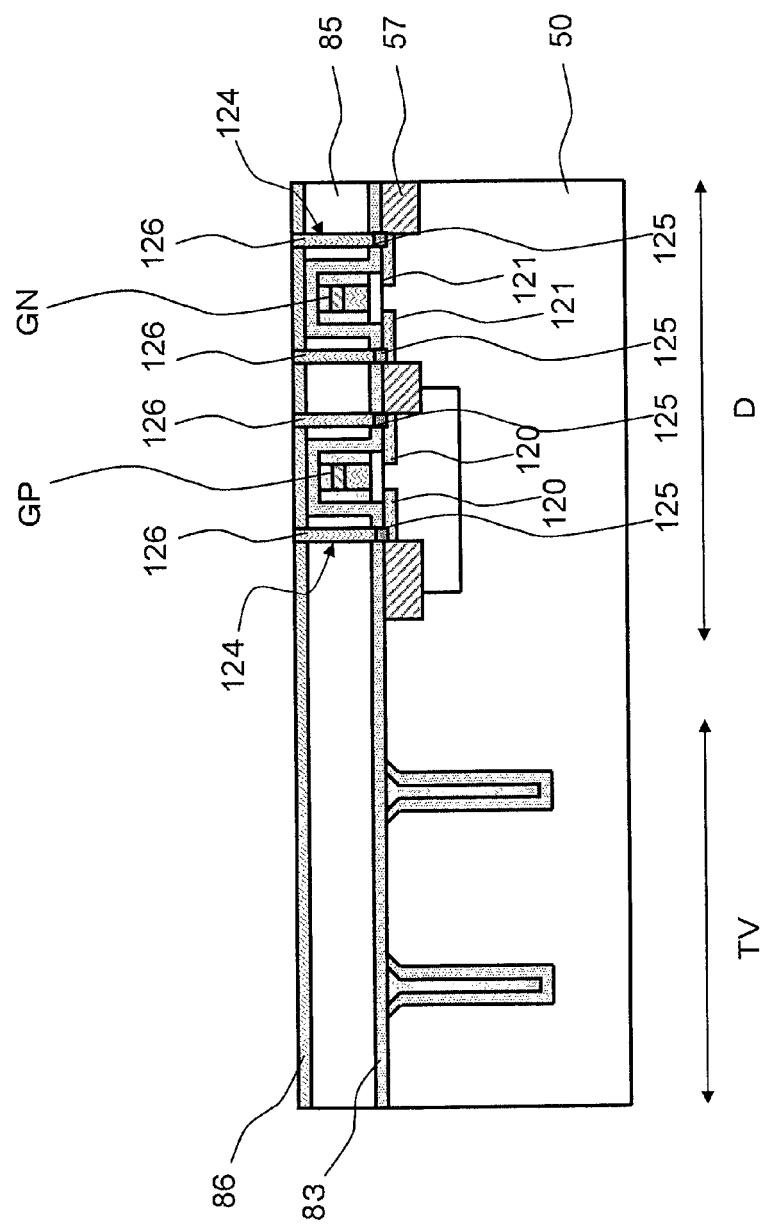

As shown in FIG. 12, a gate electrode GP and a P-type impurity diffusion layer 120 of the P channel-type MOS transistor and a gate electrode GN and an N-type impurity diffusion layer 121 of the N channel-type MOS transistor are formed. The P-type impurity diffusion layer 120 functions as source/drain electrodes of the P channel-type MOS transistor. The N-type impurity diffusion layer 121 functions as source/drain electrodes of the N channel-type MOS transistor. The source/drain electrodes 120 and 121 may be formed so as to include an LDD structure by forming sidewall insulation films on the side surfaces of the gate electrodes GP, GN.

Continuously, a liner film 83 is formed on the semiconductor substrate 50 with a silicon nitride film having a film thickness of about 10 to 20 nm. Next, after an SOD (Spin On Directrics; applied insulation film such as poly-silazane) film is deposited by a spinner method, an annealing process is performed under high-temperature vapor ($H_2O$) atmosphere, thereby modifying the solid deposited film and thus forming a first interlayer insulation film 85. The liner film 83 is formed by the oxidation-resistant film to prevent a device of the lower layer, which has been already formed, from being oxidized and damaged when annealing the SOD film.

Continuously, after a top surface of the first interlayer insulation film 85 is smoothed by a CMP process, a silicon oxide film is formed as a second interlayer insulation film 86 by the CVD method, thereby covering the surface of the first interlayer insulation film 85. Instead of the stacked structure of the first interlayer insulation film 85 and the second interlayer insulation film 86, it may be possible to deposit a silicon oxide film at one time by the CVD method.

Next, peripheral contact holes 124 reaching the P-type impurity diffusion layer 120 and the N-type impurity diffusion layer 121 in the device region D are formed by anisotropic dry etching in which a photoresist film is used as a mask pattern. A silicon surface of the semiconductor substrate 50 is exposed on bottoms of the peripheral contact holes 124.

Continuously, a silicide layer 125 such as cobalt silicide (CoSi) is formed on the silicon-exposed parts of the semiconductor substrate 50. After that, a metal film such as tungsten is deposited so as to fill up the peripheral contact holes 124. The CMP process is performed so that the metal film 93 such as tungsten remains only in the peripheral contact holes 124. Thereby, peripheral contact plugs 126 that are conducted to the source/drain electrodes of the transistors are formed in the device region D.

Figure 13:
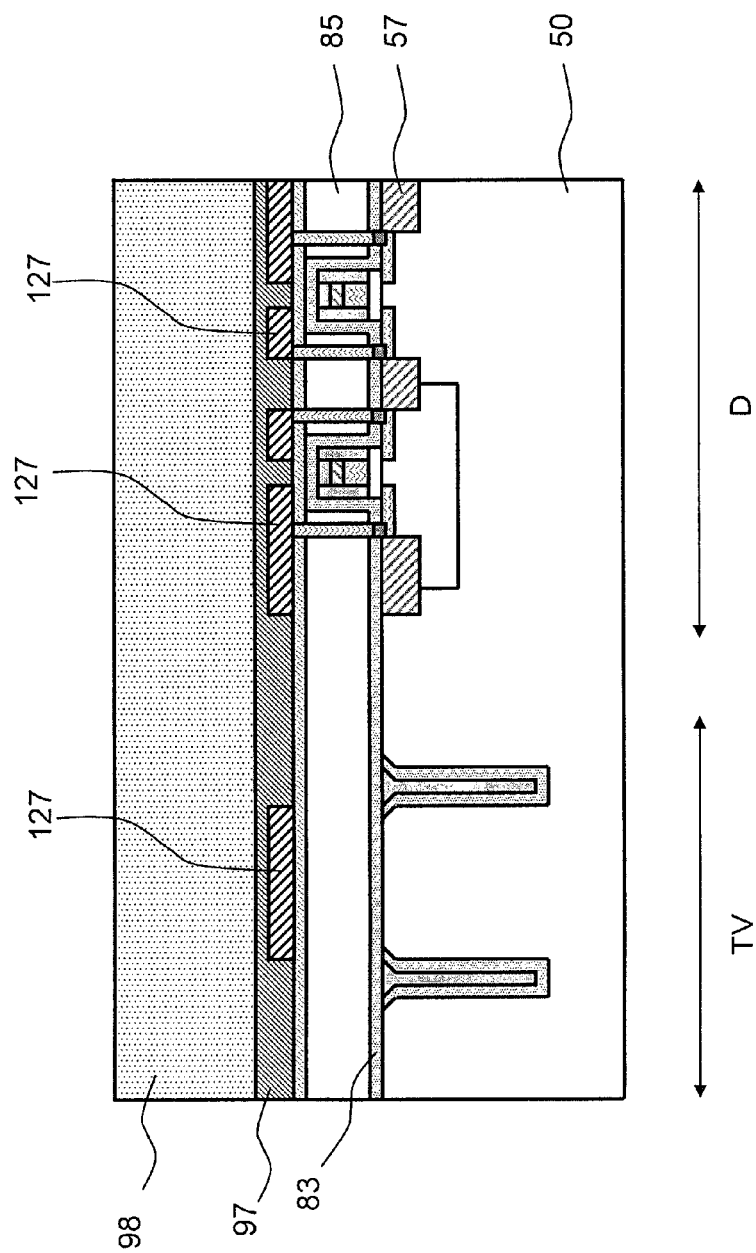

As shown in FIG. 13, tungsten nitride (WN) and tungsten (W) are sequentially deposited to form deposited films, which are then patterned to form local wirings 127. In the device region D, the local wirings 127 are connected to the peripheral contact plugs 126. The local wiring 127 is also disposed in the TSV region TV.

The local wiring 127 that is disposed in the TSV region TV may be conducted with the other local wiring 127 at a part (not shown). The local wiring 127 that is disposed in the TSV region TV functions as a pad for connection to a TSV plug V that is to be formed in a subsequent process. Next, a liner film 97 is formed to cover the local wirings 127 by using a silicon nitride film and then a third interlayer insulation film 98 is formed using an SOD film.

Figure 14:
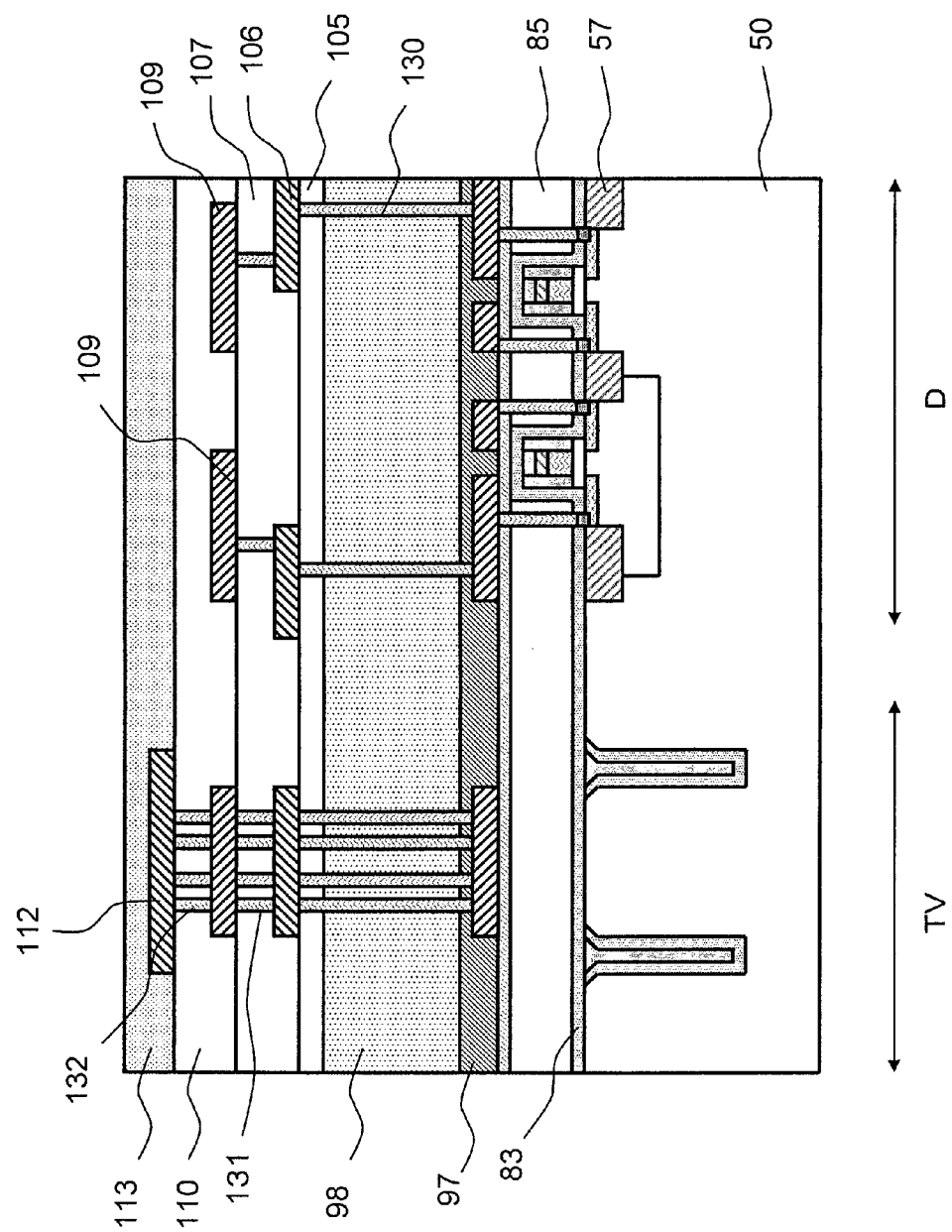

As shown in FIG. 14, a silicon oxide film is formed as a fourth interlayer insulation film 105 by the CVD method, thereby covering a surface of the third interlayer insulation film 98. Instead of the stacked structure of the third interlayer insulation film 98 and the fourth interlayer insulation film 105, a silicon oxide film may be deposited at one time by the CVD method. After that, local contact plugs 130 that are connected to the local wirings 127 in the device region D are formed using a metal film such as tungsten. The local contact plugs 130 are also formed to connect to the local wiring 127 that is disposed in the TSV region TV.

Next, first wirings 106 of the upper layer are formed using aluminum (Al), copper (Cu). In the device region D and the TSV region TV, the first wirings 106 are formed to connect to the local contact plugs 130. A fifth interlayer insulation film 107 is formed to cover the first wirings 106 using a silicon oxide film and the like. First contact plugs 131 that are connected to the first wirings 106 are formed by a metal film such as tungsten and the like.

Next, second wirings 109 are formed using aluminum (Al), copper (Cu) and the like. In the device region D and the TSV region TV, the second wirings 109 are formed to connect to the first contact plugs 131. A sixth interlayer insulation film 110 is formed to cover the second wirings 109 using a silicon oxide film and the like. Second contact plugs 132 that are connected to the second wirings 109 are formed using a metal film such as tungsten and the like in the TSV region TV.

Next, a third wiring 112 is formed using aluminum and the like. The third wiring 112 is a wiring layer of the uppermost layer and also serves as a pad when forming a bump electrode on a surface thereof. Accordingly, it is preferable not to use a metal film that is apt to be naturally oxidized, such as copper (Cu) and the like. Also in the device region D, the third wiring 112 may be disposed and used as a wiring layer that is connected to the second wirings 109. A surface protective film 113 is formed using a silicon oxynitride (SiON) and the like so as to cover the third wiring 112. In the meantime, when forming the second wirings 109 or third wiring 112, a dual damascene method or aluminum reflow method may be used to form the contact plugs that are connected to lower surfaces of the respective wirings and to form the wiring layer 109 or 112 at the same time.

Continuously, a process for forming a through silicon via in the TSV region TV will be described.

Figure 15:
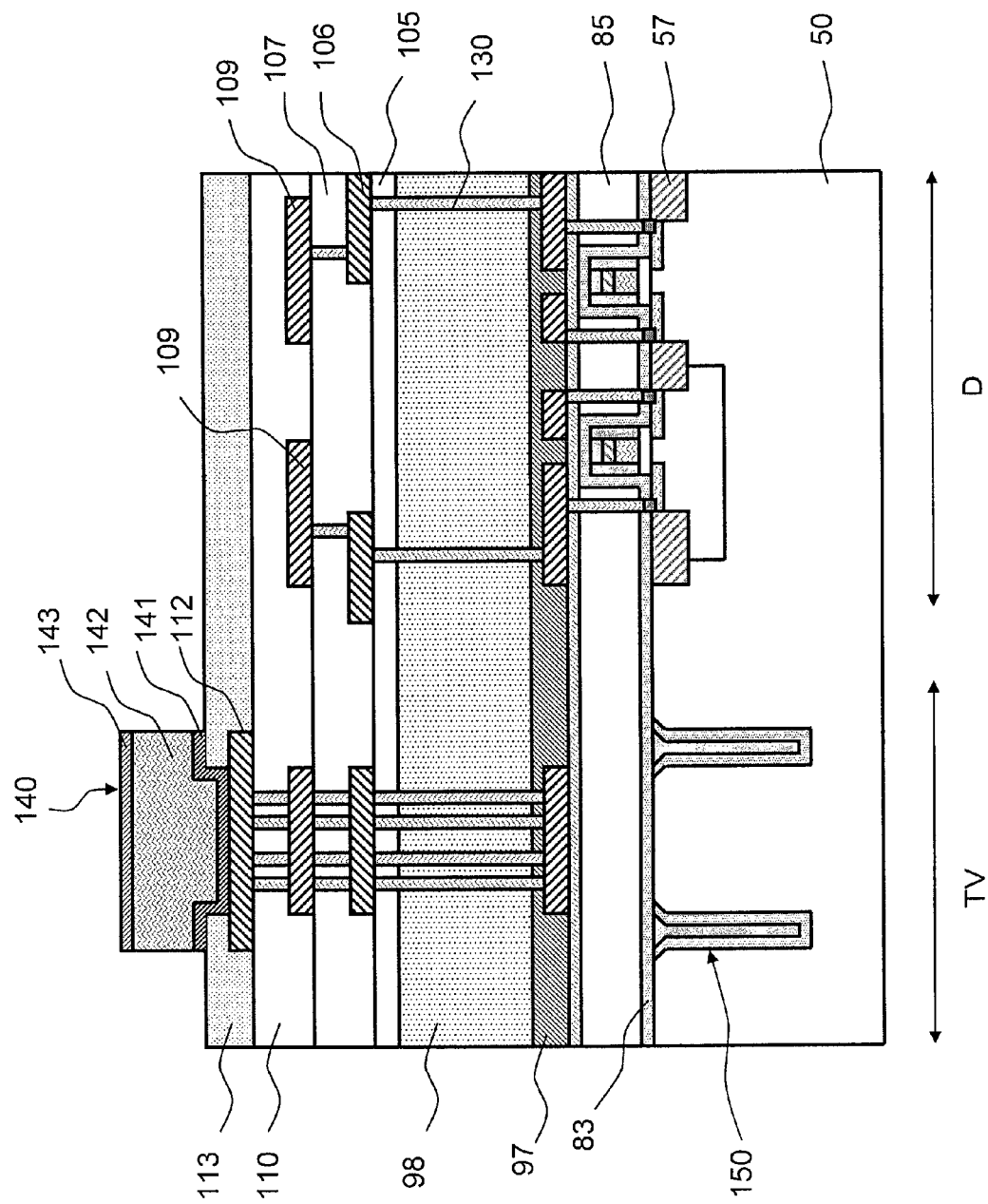

As shown in FIG. 15, the third wiring 112 of the uppermost layer that is disposed in the TSV region TV functions as a pad for forming a topside bump 140. An opening (hole) is formed in the protective film 113 so as to expose the upper surface of the third wiring 112 and a topside bump 140 that is connected to the third wiring 112 is formed. The topside bump 140 is formed by three layers of a seed film 141 including copper deposited on a titanium (Ti) film, a copper bump 142 and a surface metal film 143. As the surface metal film 143, an alloy film (Sn—Ag film) of tin and silver having a film thickness of about 2 to 4 μm may be exemplified. The copper bump 142 is formed so as to have a height (bump film thickness) of about 10 to 12 μm by an electrolytic plating method.

Figure 16:
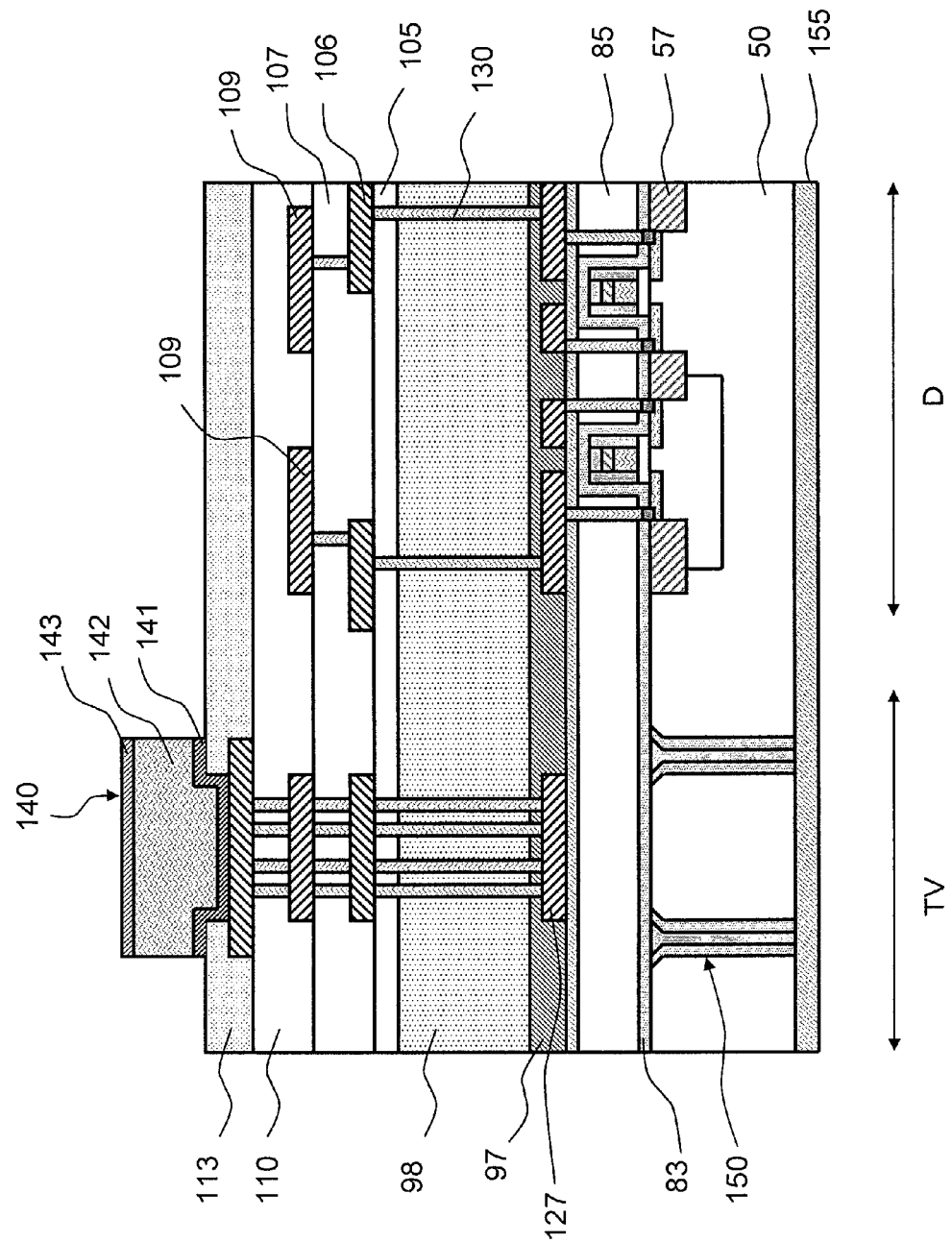

As shown in FIG. 16, a support substrate (not shown) of acrylic resin, quartz and the like is bonded on the surface side (upper surface side in FIG. 16) of the semiconductor substrate 50 via an adhesive layer (not shown) and the backside (lower surface side in FIG. 16) of the semiconductor substrate 50 is then ground (back grinding) to reduce a film thickness up to a predetermined thickness (for example, 40 μm). By the grinding process, a bottom of the insulation ring 150 that has already been formed is exposed on the backside of the semiconductor substrate 50. A silicon nitride film 155 is formed to have a film thickness of about 200 to 400 nm so as to cover the backside of the semiconductor substrate 50. The silicon nitride film 155 prevents the copper, which is used for the TSV plugs V to be formed in a subsequent process, from diffusing into the semiconductor substrate 50 from the backside thereof during the manufacturing process and thus influencing the device characteristics adversely.

Figure 17:
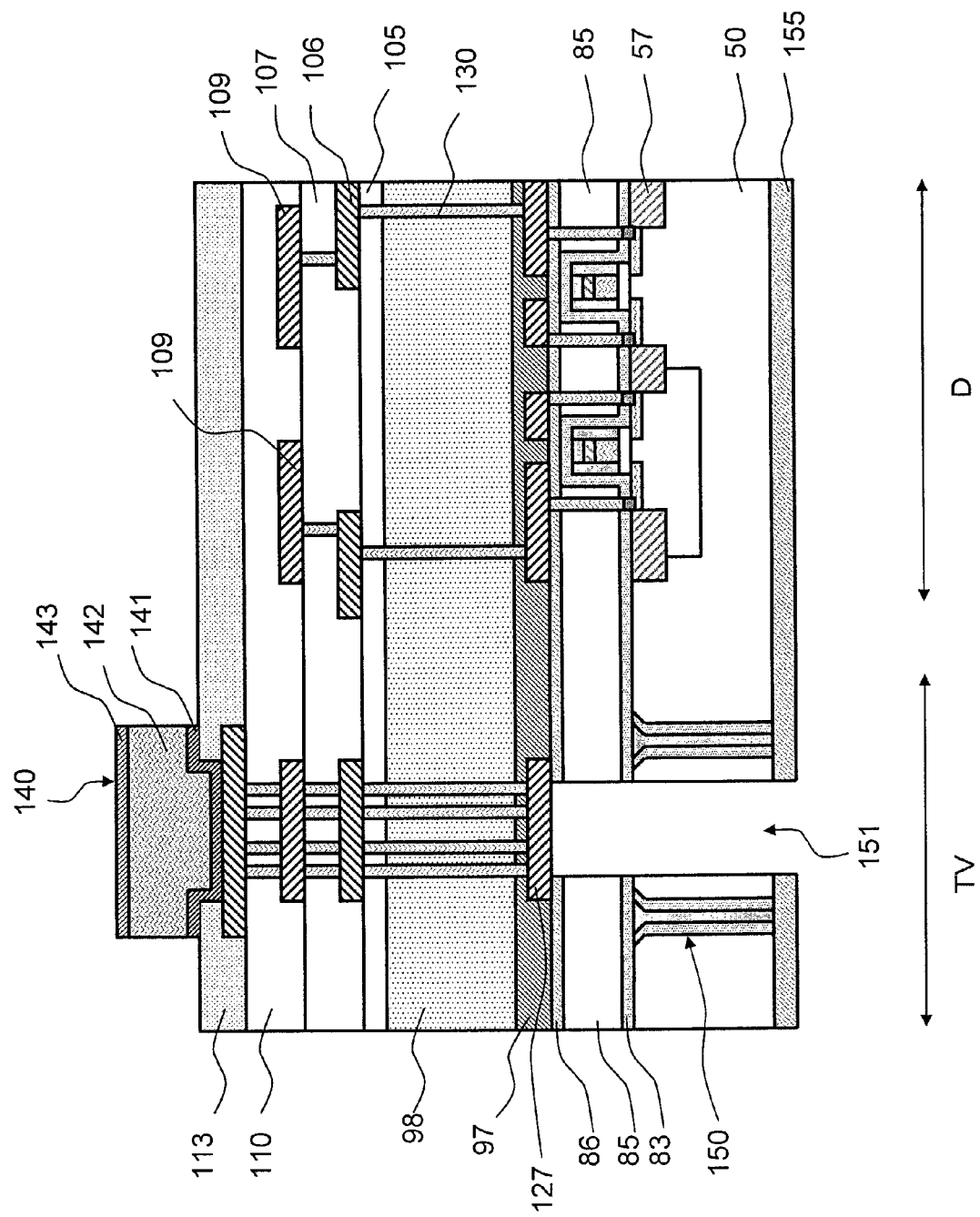

As shown in FIG. 17, an opening (hole) 151 is formed by the anisotropic dry etching so that a backside of the local wiring 127, which is disposed in the TSV region TV, is exposed. The opening 151 is formed to penetrate through the silicon nitride film 155, the semiconductor substrate 50, the liner film 83, the first interlayer insulation film 85 and the second interlayer insulation film 86. At a bottom side (the upper side in FIG. 17) of the opening 151, the backside of the local wiring 127 is exposed. The dry etching of forming the opening 151 may be performed in two steps of the silicon etching of the semiconductor substrate 50 and the insulation film etching of the first interlayer insulation film 85 and the like separately. In addition, regarding the silicon etching of the semiconductor substrate 50, the conventional Bosch process having no tapered portion may be used because a size of the opening is sufficiently large.

Next, as shown in FIG. 1, the backside bump 160 integrated with the through-plug V filling the inside of the opening 151 is formed. The backside bump 160 is made of three layers of a seed film 161 including copper deposited on a titanium (Ti) film, a copper bump 162 and a backside metal film 163. As the backside metal film 163, a deposition film (Au/Ni film) including gold (Au) deposited on nickel (Ni) and having a film thickness of about 2 to 4 μm may be exemplified. The copper bump 162 is formed to fill up the inside of the opening 151 via the seed film 161 by the electrolytic plating method and also serves as the through-plug V.

The backside bump 160 is formed so that a height (bump height) protruding from the backside of the semiconductor substrate 50 is about 8 μm or smaller. The backside bump 160 is preferably formed so that the exposed surface side (the lower surface in FIG. 1) of it is smooth. After forming the backside bump 160, the support substrate is removed.

By the above processes, the semiconductor chip including the TSVs 200 including the structure shown in FIG. 1 is completely formed, so that the semiconductor device of this exemplary embodiment is completed.

In addition to the above specific example, the invention can be also used as a method for forming a trench including a tapered portion in a semiconductor substrate when forming a device including a MEMS (Micro Electro Mechanical Systems) structure, such as acceleration sensor. Also, the material for filling up the inside of the formed trench 150c is not limited to the insulation film. For example, even when the trench 150c is filled up with a conductive film by the CVD, the invention can be applied. In this case, for example, a contact plug can be formed using the conductive film.

In addition, the substrate in which the trench is to be formed is not limited to the substrate of a silicon single layer. For example, regarding a SOI (Silicon On Insulator) substrate in which a semiconductor layer having a thickness of about 10 to 100 μm is formed on an insulation film, the invention can be used as a method for processing the semiconductor layer. The width and depth of the trench for the insulation ring 150c that is formed by the invention are not limited with respect of the sizes thereof. However, when the invention is applied for forming a trench having an aspect ratio of 10 or greater, it is possible to realize the great effect from a standpoint of improvement on the embedding characteristic.

In the below, modified embodiments of the first exemplary embodiment will be described.

First Modified Embodiment

This modified embodiment is different from the first exemplary embodiment, in that the trench for insulation ring 150c is filled up with a silicon oxide, a silicon nitride, NSG (Non-doped Silicate Glass), and BPSG (Boron Phosphorous Silicon Glass). In the below, the process different from the first exemplary embodiment will be mainly described.

Figure 18:
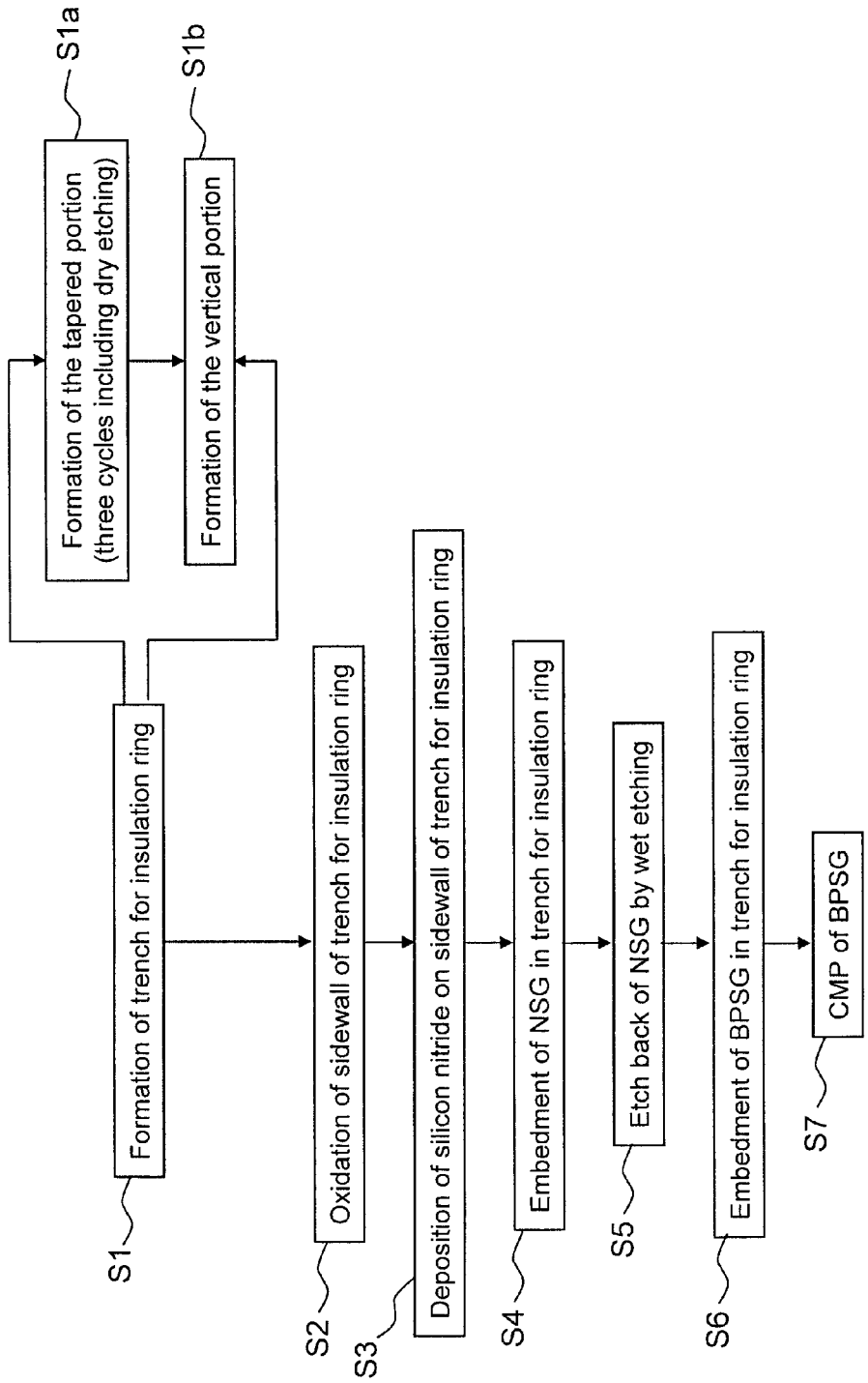
FIG. 18 is a flowchart showing a manufacturing method according to a first modified embodiment of the first exemplary embodiment.

FIG. 18 is a flowchart showing a manufacturing method according to a first modified embodiment of the first exemplary embodiment. As shown in FIG. 18, like the first exemplary embodiment, the trench for insulation ring 150c is formed (S1). In this process, as described above, the first to third cycles including dry etching process are performed to form the tapered portion 15 which includes three scallop-forming trenches 18 (S1a). Next, as described above, the vertical portion 16 is formed (S1b).

Subsequently, an exposed sidewall of the trench for insulation ring 150c is thermally heated to form a silicon oxide film 41 (S2). A silicon nitride film 44 is formed on the silicon oxide film 41 (S3). After NSG (Non-doped Silicate Glass) 42 is formed over the first surface 5 of the semiconductor substrate 50 in order to extend in the trench for the insulation ring 150c (S4), NSG 42 is etched back by wet etching (S5). Accordingly, NSG is planarized by this etching back. Since a portion of the trench for insulation ring 150c closer to the first surface 5 has a larger diameter, void generates in the portion. After BPSG (Boron Phosphorous Silicon Glass) 43 is formed over the first surface 5 of the semiconductor substrate 50 (S6), BPSG is planarized by CMP (S7).

Figure 19:
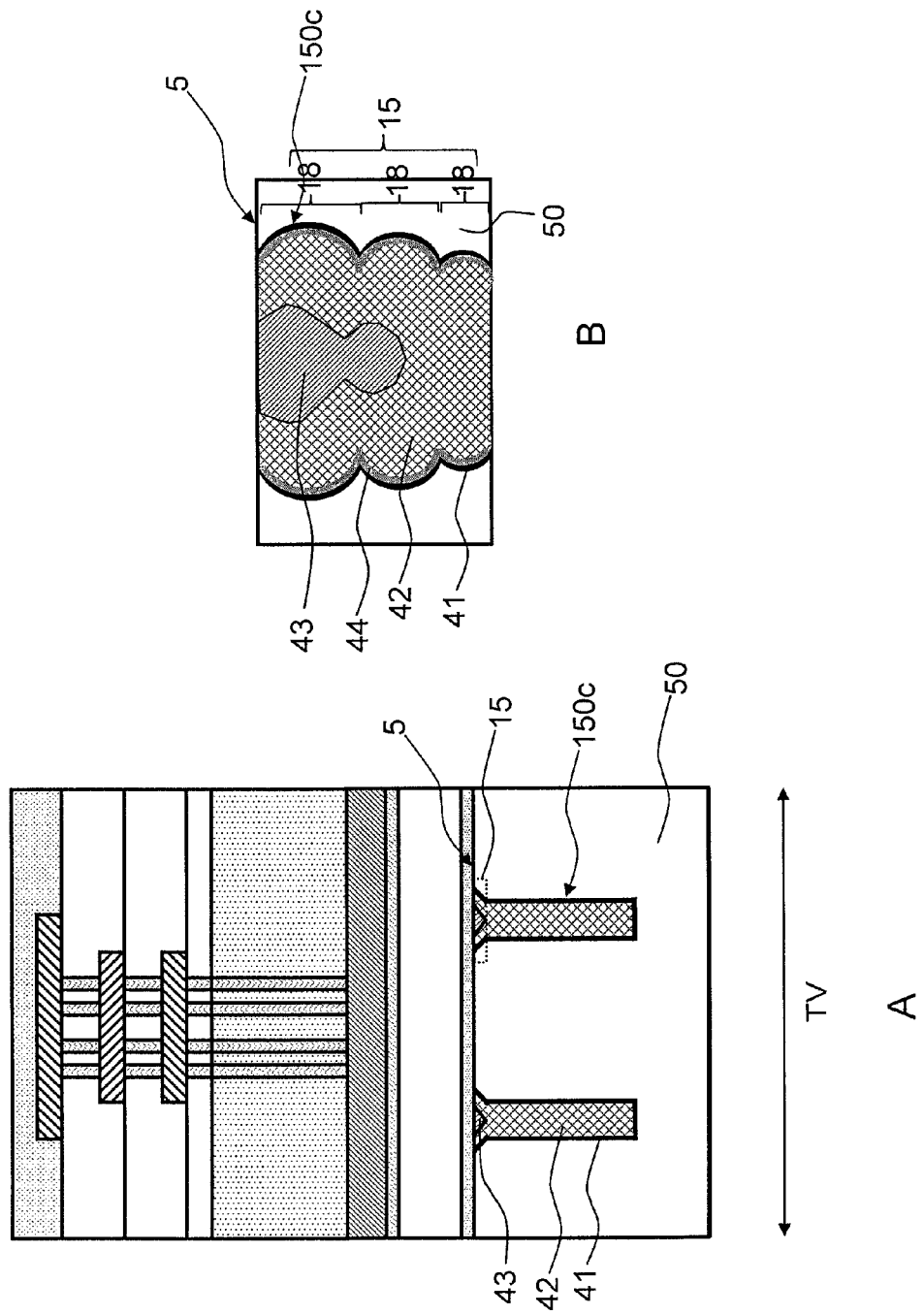
FIG. 19 shows a first modified embodiment of the first exemplary embodiment.

FIG. 19A is a sectional view illustrating a structure after S7, and corresponds to FIG. 14 according to first exemplary embodiment. In FIG. 19A, the tapered portion 15 is schematically illustrated, and the silicon nitride 44 is omitted. FIG. 19B is a enlarged view of the tapered portion 15 surrounded by the dotted line in FIG. 19A. As shown in FIG. 19B, the tapered portion 15 comprises three scallop-forming trenches 18. The silicon oxide 41, silicon nitride 44, NSG 42 and BPSG 43 are filled up in this order on the sidewall in the trench for insulation ring 150c of the tapered portion 15.

After that, an upper structure is formed on the first surface 5 of the semiconductor substrate 50, as the first exemplary embodiment.

Second Modified Embodiment

This modified embodiment is different from the first exemplary embodiment, in that after the trench for insulation ring 150c is formed, an etching process for smoothing and rounding the edges 7 by the scalloping is further added. In the below, only the process different from the first exemplary embodiment will be described and the descriptions of the other processes will be omitted.

Figure 25:
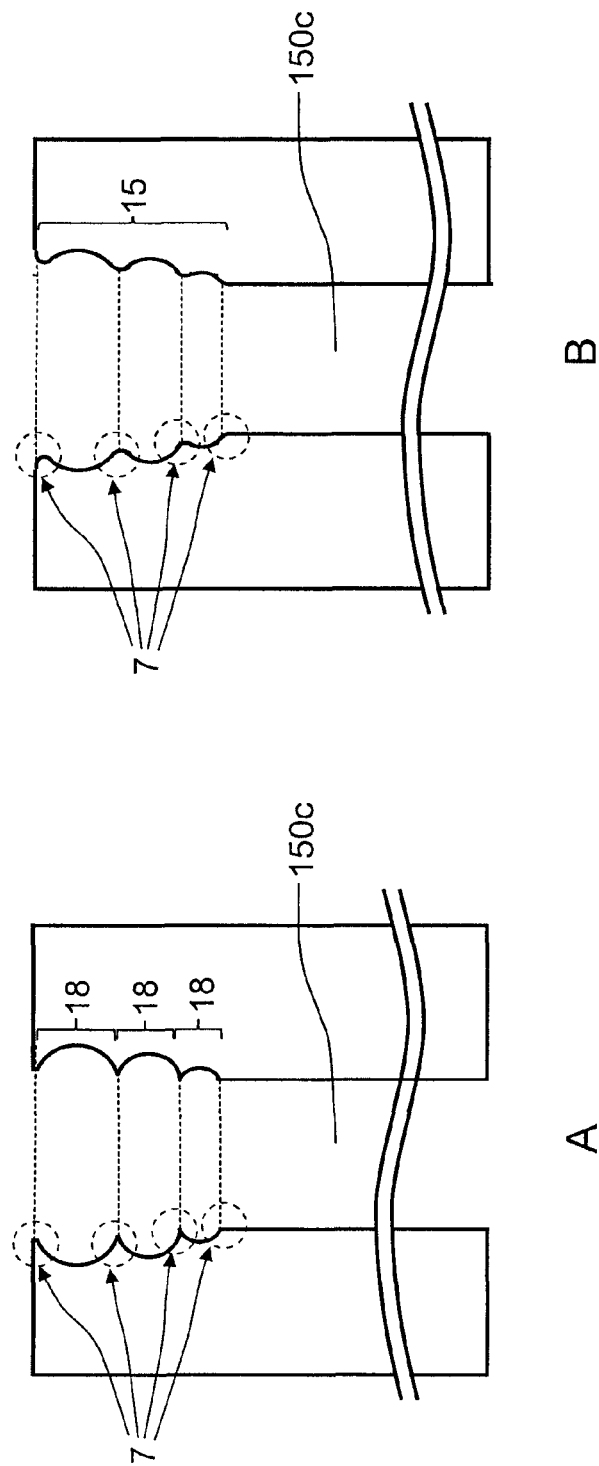
FIG. 25 shows a second modified embodiment of the first exemplary embodiment.

FIG. 25A is a sectional view after the process of FIG. 8 of the first exemplary embodiment is completed. As shown in FIG. 25A, after the trench for insulation ring 150c is formed, edges (upper edge and lower edge) 7 by the scalloping are formed on the inner wall side surface of each scallop-forming trench 18 of the trench for insulation ring 150c. As shown in FIG. 25B, the edges 7 are rounded by etching the inner wall of the trench for insulation ring 150c, thereby changing it to a smooth surface without an acute peak.

In this modified embodiment, it is possible to further smooth the tapered portion 15 and the vertical portion, compared to the first exemplary embodiment. As a result, it is possible to prevent the void from being formed in the insulation ring more effectively, compared to the first exemplary embodiment, thereby effectively suppressing the manufacturing yield from being lowered.

Third Modified Embodiment

This modified embodiment is different from the first exemplary embodiment, in that after the trench for insulation ring 150c is formed, a process for forming an insulation film 8 on the inner wall side surface of the trench for insulation ring 150c and an etching process for etching the inner wall side surface of the trench for insulation ring 150c are further performed. In the below, only the process different from the first exemplary embodiment will be described and the descriptions of the other processes will be omitted.

Figure 26:
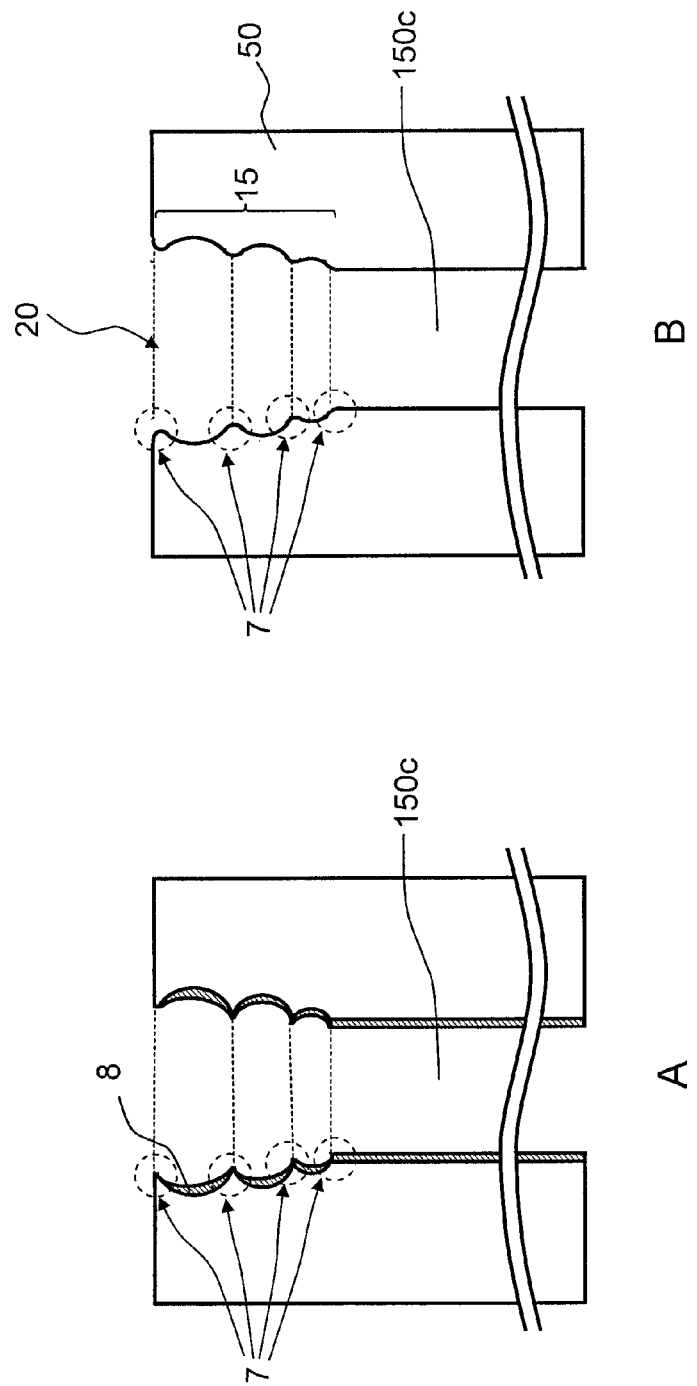
FIG. 26 shows a third modified embodiment of the first exemplary embodiment.

As shown in FIG. 26A, after the process of FIG. 8 of the first exemplary embodiment is completed, an insulation film 8 is formed over the semiconductor substrate 50 and an etch-back process is performed. Thereby, an insulation film 8 is formed on the inner wall side surface of the trench for insulation ring 150c in such a degree that a part of the edges 7 by the scalloping is exposed. As shown in FIG. 26B, the inner wall side surface of the trench for insulation ring 150c are etched. At this time, the edges 7 are preferentially removed and rounded due to a difference between etching rates of the insulation film 8 and the semiconductor substrate 50. Depending on the etching conditions, the insulation film 8 may be removed or remain. However, it is preferable to remove the insulation film 8 so as to enlarge a diameter of the trench for insulation ring 150c as large as possible.

As the insulation film 8, TEOS—NSG (Tetraethyl orthosilicate Tetraethoxysilane—None—doped Silicate Glass) may be used. The etching conditions may include conditions that the gas including $SF_6$ and $NH_3$ is used and the high temperature such as 100° C. or higher is set.

In addition, after etching the insulation film 8, an insulation film 8 may be further formed on the inner wall side surface of the trench for insulation ring 150c for smoothing. Furthermore, considering the series of processes of forming the insulation film 8 on the inner wall side surface of the trench for insulation ring 150c, etching the inner wall side surface of the trench for insulation ring 150c and forming the insulation film 8 on the inner wall side surface of the trench for insulation ring 150c as one cycle, a plurality of the cycles may be performed.

In this modified embodiment, it is possible to further smooth the tapered portion 15, compared to the first exemplary embodiment. As a result, it is possible to prevent the void from being formed in the insulation ring more effectively, compared to the first exemplary embodiment, thereby effectively suppressing the manufacturing yield from being lowered.

As describe above, according to the present invention, the trench 150c including a wide opening 20 and substantially vertical sidewall under the opening 20 can be obtained. In the present invention, by changing an etching time, the trench 150c having any tapered shape can be formed with a controlled performance. Accordingly, a most suitable trench 150c capable of preventing a void from generating can be formed. For example, trench 150c filled up with an insulation film by CVD is exemplified, as the preferable example.

As shown in the modified embodiment, the protective film 8 on the sidewall of the trench 150c is removed and then for example, after the surface of the silicon substrate 50 is exposed, an acute peak (edge) 7 on the sidewall of the trench 150c is rounded, thereby preventing the void from generating more effectively, as the more preferable example. The method for rounding the peak (edge) 7 includes adding of an isotropic etching. In this case, the peak (edge) 7 is smoothened. In addition, since an etching rate of the peak 7 adjacent to the opening 20 of the trench 150c is apt to become faster comparatively, a trench shape is formed so that it has a smooth surface and becomes larger moderately from the lower portion of the trench 150c to the opening 20. If a silicon substrate is etched, a gas containing F may be used in a gas phase reaction process. For example, $NH_3$ gas may be supplied at a flow rate of 100 sccm, and Si may be isotropically etched under conditions of 10 Torr and room temperature. Alternatively, HCl gas may be supplied at a flow rate of 200 sccm, and Si may be isotropically etched under conditions of 40 Torr and 600° C. The peak (edge) 7 may also be removed by sputter-etching. As the other method for rounding the peak (edge) 7, the CVD film may be formed on the peak (edge) 7. By combining the forming of the CVD film with the etching the substrate, the more improved effects are obtained.

(Second Exemplary Embodiment)

Next, an application example of the first exemplary embodiment will be described.

Figure 20:
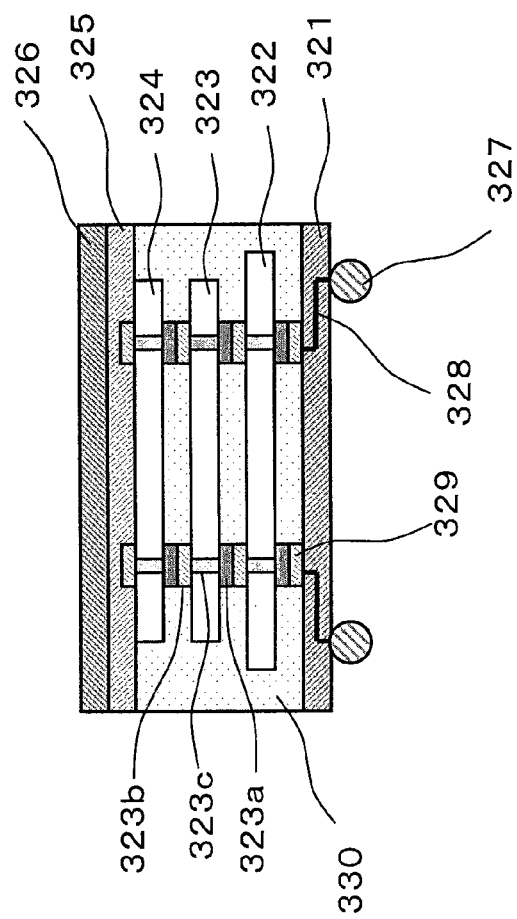
FIGS. 20 and 21 show a semiconductor device of a second exemplary embodiment.

FIG. 20 is a sectional view of a highly integrated package with the stacked two DRAM chips including TSVs, which are formed according to the first exemplary embodiment. Semiconductor chips 323, 324 are core chips of the DRAMs that are formed according to this exemplary embodiment, and includes as a memory cell circuit and a peripheral circuit for data input and output with respect to the memory cell. The specific structure of the TSV is the same as the above structure and thus is not shown in FIG. 20. In addition, the insulation ring is omitted in FIG. 20.

The semiconductor chips 323, 324 comprise the TSVs including the same structure. In the below, the semiconductor chip 323 will be described as an example. The semiconductor chip 323 comprises a plurality of backside bumps 323a, topside bumps 323b and a plurality of TSVs 323c, each of which connects backside bump 323a and topside bump 323b.

The semiconductor chip 322 functions as an interface chip and is made from a logic circuit that controls input and output of data with regard to each of the DRAM core chips 323, 324 and input and output of data to the outside of the package. The interface chip 322 also includes TSVs, which are formed by the above exemplary embodiment, and the same topside and backside bumps as the DRAM core chips 323, 324.

Each of the semiconductor chips is individualized by dicing after forming the TSVs. The semiconductor chips to be stacked have the same arrangement of the TSVs and may have different chip sizes.

The uppermost semiconductor chip 324 comprises a surface that includes the topside bump and is fixed to a metal lead frame 326 by an attaching film 325. By repeating processes of arraigning the TSVs of the three semiconductor chips with each other and temporarily fixing the TSVs with each other by low-temperature (about 150 to 170° C.) heating, the three semiconductor chips are sequentially stacked. At this time, by primarily fixing the uppermost semiconductor chip 324 and the lead frame 326, it can be used as a basis when stacking the respective chips. After all the semiconductor chips are stacked, the respective semiconductor chips are completely fixed by applying the temperature of about 250 to 300° C. under the constant pressure.

A reference numeral 321 indicates a base substrate. The base substrate 321 and the lowermost semiconductor chip 322 are connected via terminals 329. A resin 330 is filled between the semiconductor chips, thereby protecting the respective semiconductor chips. The base substrate 321 comprises a plurality of soldered balls 327 and is connected to the TSVs of the interface chip 322 via a wiring layer 328 and the terminals 329. The soldered balls 327 are applied with input and output signals from the outside, a power supply voltage and the like. In the meantime, three or more semiconductor chips may be stacked.

Figure 21:
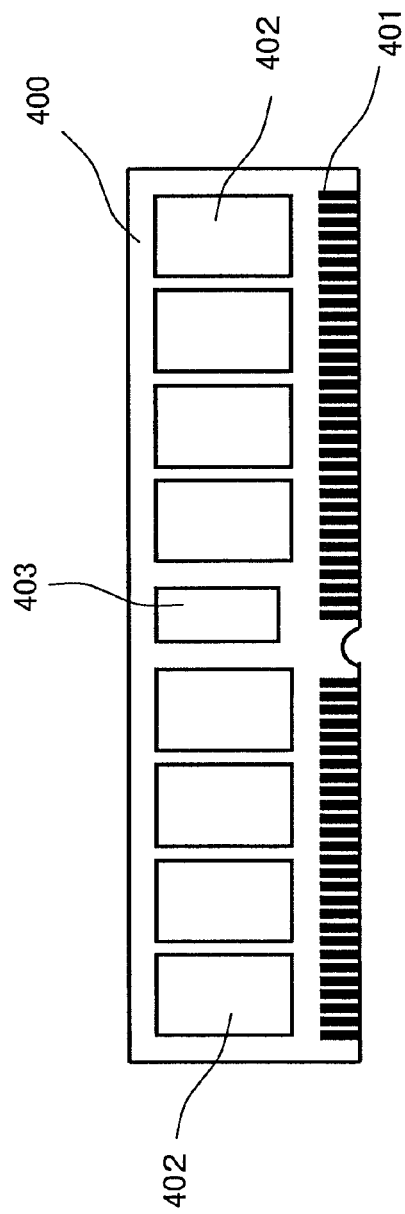

FIG. 21 is a pictorial view showing a memory module including DRAM packages manufactured as described above. A reference numeral 402 indicates a DRAM package that is manufactured as shown in FIG. 20 and is mounted on a printed substrate 400. The printed substrate 400 comprises a plurality of input/output terminals (I/O terminals) 401 for electrically connecting the memory module to an external device. The data is input and output to and from the respective DRAM packages 402 via the I/O terminals 401.

The memory module comprises a control chip 403 that controls the input/output of the data to and from the respective DRAM packages. The control chip 403 performs timing adjustment of a clock signal that is input from the outside of the memory module, shaping of a signal waveform and the like, thereby supplying the same to the respective DRAM packages. In the meantime, only the plurality of DRAM packages may be mounted without arranging the control chip 403 on the printed substrate 400.

By using this exemplary embodiment, it is possible to easily manufacture a DRAM chip with high integration corresponding to the miniaturization, thereby making it possible to form a memory module corresponding to data storage of large capacity. By using the above memory module including the DRAM chips formed by this exemplary embodiment, it is possible to form a data processing device that will be described in the below.

(Third Exemplary Embodiment)

Figure 22:
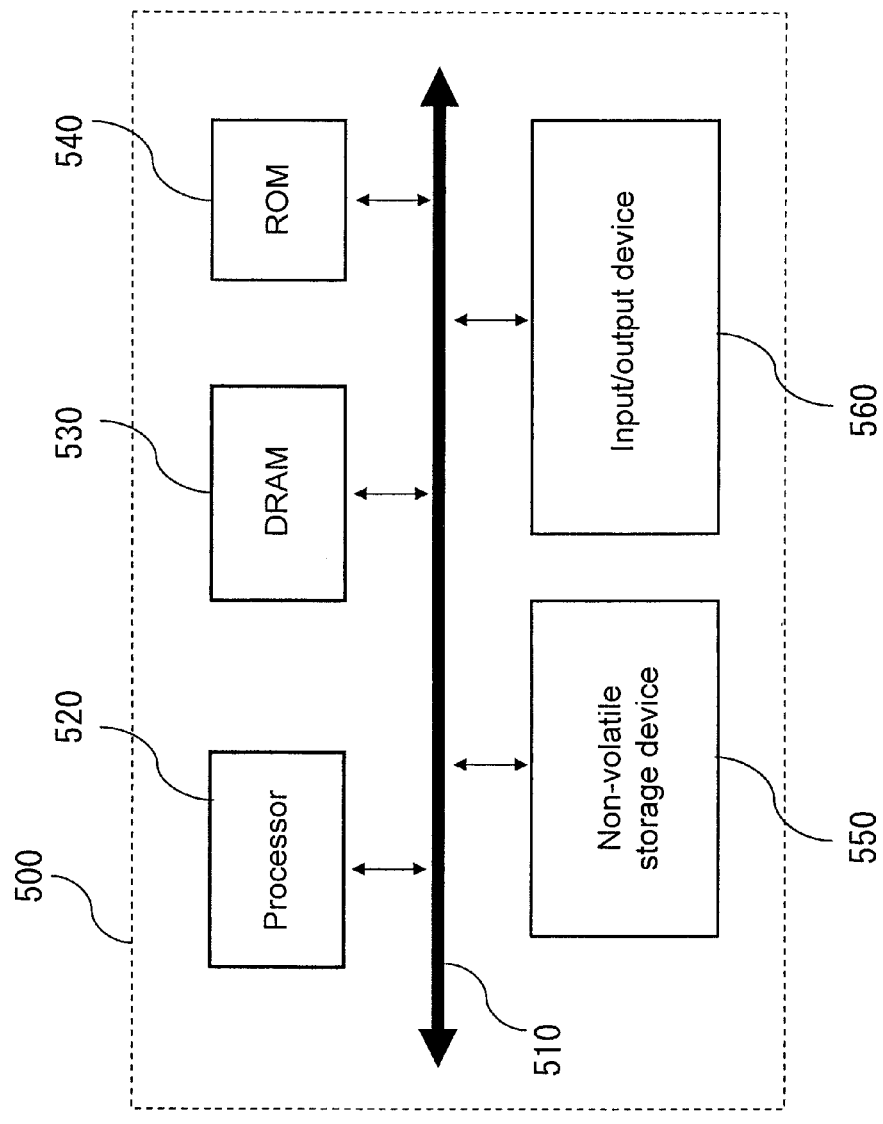
FIG. 22 shows a semiconductor device of a third exemplary embodiment.

FIG. 22 schematically shows a configuration of a data processing device 500 according to this exemplary embodiment. The data processing device 500 includes a calculation processing device (processor) 520 and a DRAM memory module 530, which are connected to each other via a system bus 510. The processor 520 may be a micro processing unit (MPU), a digital signal processor (DSP) and the like. The DRAM memory module 530 comprises a DRAM chip that is formed according to this exemplary embodiment. In addition, a read only memory (ROM) 540 for storing fixed data may be connected to the system bus 510.

Although only one system bus 510 is shown for simplification, a plurality of system buses 510 may be connected serially or in parallel through a connector and the like, as required. In addition, the respective devices may be connected to each other by a local bus, rather than the system bus 510.

Also, in the data processing device 500, a non-volatile storage device 550 and an input/output device 560 are connected to the system bus 510, as required. A hard disk drive, an optical drive, a solid state drive (SSD) and the like may be used as the non-volatile storage device. The input/output device 560 includes a display device such as liquid crystal display and a data input device such as keyboard, for example.

Figure 23:
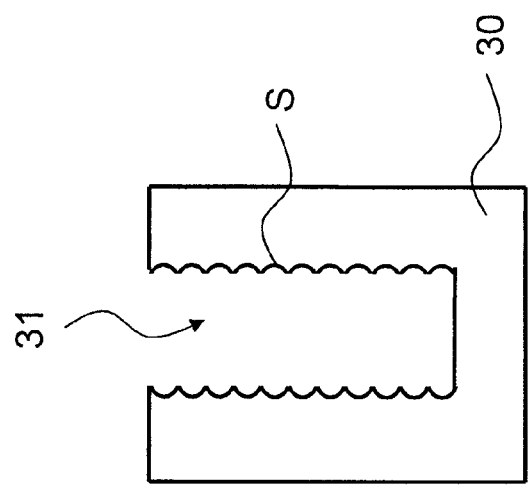
FIGS. 23 and 24 show a method of manufacturing a semiconductor device of the related art.
Figure 24:
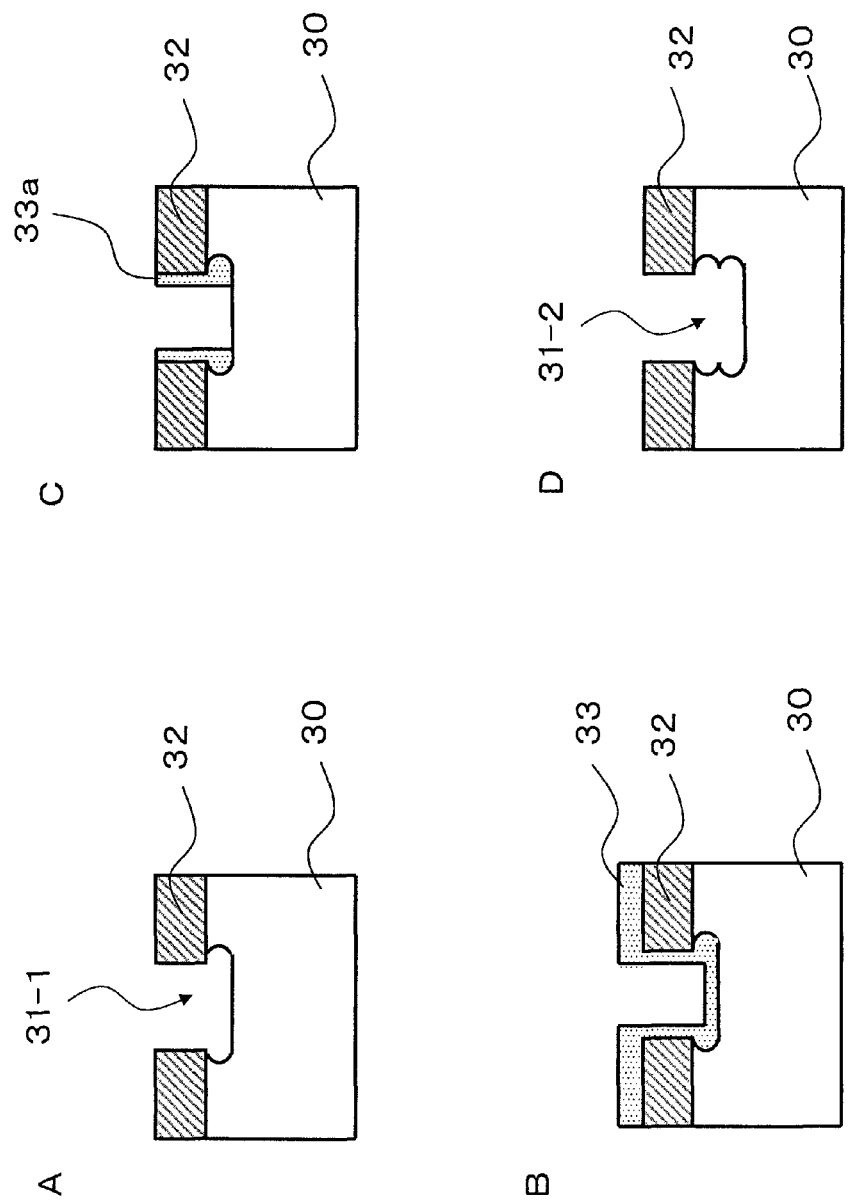

In FIG. 23, the number of each constitutional element of the data processing device 500 is one for simplification. However, the invention is not limited thereto and one or more of each constitutional element may be provided in plural. The data processing device 500 includes a computer system, for example. However, the invention is not limited thereto.

By using this exemplary embodiment, it is possible to easily manufacture a DRAM chip with high integration corresponding to the miniaturization, thereby making it possible to form a data processing device having high performance.

It is apparent that the present invention is not limited to the above embodiments, but may be modified and changed without departing from the scope and spirit of the invention.

In addition, while not specifically claimed in the claim section, the applications reserve the right to include in the claim section at any appropriate time the following semiconductor device and method:

1. A method of manufacturing a semiconductor device, comprising:

forming a tapered portion including a scalloping-forming trench from a first surface of a material layer inward in a thickness direction thereof; and forming a vertical portion including a plurality of scalloping-forming trenches under the tapered portion in the material layer, wherein the scalloping-forming trench of the tapered portion has a sectional area $S_{(n)}$ (n: an integer of 1 or greater) of a section perpendicular to the thickness direction of the material layer, the $S_{(n)}$ being changed inward in the thickness direction and having a maximum value $S_{(n)max}$ (n: an integer of 1 or greater) of the $S_{(n)}$, wherein the scalloping-forming trenches of the vertical portion are formed by repeating a process for forming one scalloping-forming trench twice or more so that each scalloping-forming trench of the vertical portion has a sectional area $S'_{(a)}$ (a: an integer of 1 or greater) of a section perpendicular to the thickness direction of the material layer, the $S'_{(a)}$ being changed inward in the thickness direction and so that a maximum value $S'_{(a)max}$ (a: an integer of 1 or greater) of the $S'_{(a)}$ of each scalloping-forming trench of the vertical portion is a constant value, and wherein the vertical portion is formed so that the $S'_{(a)max}$ is smaller than any $S_{(n)max}$.

2. The method of manufacturing a semiconductor device according to the above 1, wherein the forming the tapered portion comprises:
forming a mask pattern on the first surface of the material layer;
forming a first scalloping-forming trench in the material layer by etching using the mask pattern;
forming a protective film on an inner wall of the first scalloping-forming trench; and
removing the protective film on a bottom surface of the first scalloping-forming trench by etching.

3. The method of manufacturing a semiconductor device according to the above 2, wherein in forming the tapered portion, two or more scalloping-forming trenches are formed,
the $S_{(n)max}$ of each scalloping-forming trench of the tapered portion is gradually decreased from the first surface of the material layer inward in the thickness direction thereof, and
the $S_{(n)max}$ of the lowermost scalloping-forming trench of the tapered portion farthest from the first surface of the material layer in the thickness direction thereof is greater than the $S'_{(a)max}$.

4. The method of manufacturing a semiconductor device according to the above 3, wherein the method further comprises, after removing the protective film, performing a first cycle including following steps (A1) to (A3) one or more times to form the scalloping-forming trench in the material layer in order to connect with the first scalloping-forming trench:
(A1) etching the material layer by using the mask pattern and the protective film remaining in the scalloping-forming trench as a mask, to newly form the scalloping-forming trench under the scalloping-forming trench farthest from the first surface of the material layer in the thickness direction thereof;
(A2) forming the protective film on the inner wall of the newly formed scalloping-forming trench; and
(A3) removing the protective film on the bottom surface of the newly formed scalloping-forming trench by etching the material layer.

5. The method of manufacturing a semiconductor device according to the above 4, wherein in forming the tapered portion, an etching time of the step (A1) is shortened every one first cycle.

6. The method of manufacturing a semiconductor device according to any one of the above 1 to 5, wherein in forming the vertical portion, a second cycle including following steps (B1) to (B3) is repeated twice or more times, to form two or more scalloping-forming trenches in the material layer so as to connect with the tapered portion:
(B1) etching the material layer by using the mask pattern and the protective film remaining in the scalloping-forming trench as a mask, to newly form the scalloping-forming trench under the scalloping-forming trench farthest from the first surface of the material layer in the thickness direction thereof;
(B2) forming the protective film on the inner wall of the newly formed scalloping-forming trench; and
(B3) removing the protective film on the bottom surface of the newly formed scalloping-forming trench by etching the material layer.

7. The method of manufacturing a semiconductor device according to the above 6, wherein in forming the vertical portion, the method comprises, after the step (B1) of the last second cycle, removing the protective film so that the protective film does not remain in the tapered portion and the vertical portion, instead of the steps (B2) and (B3).

8. The method of manufacturing a semiconductor device according to any one of the above 1 to 7, wherein the material layer is a silicon substrate, and
in forming the tapered portion and the vertical portion, the method comprises performing a dry etching using $SF_6$ gas.

9. The method of manufacturing a semiconductor device according to any one of the above 2 to 7, wherein the protective film includes a polymer containing carbon as a main component, and
in forming the protective film, a deposition step using $C_4F_8$ gas is performed.

10. The method of manufacturing a semiconductor device according to any one of the above 1 to 9, wherein the method comprises, before forming the tapered portion, forming an electrode penetrating through the material layer in the thickness direction thereof,
the tapered portion and the vertical portion connecting with each other are formed so that the tapered and vertical portions penetrate through the material layer and surround an outer side surface of the electrode, and
the method further comprises filling up the tapered and vertical portions with an insulation film, to form an insulation ring surrounding the outer side surface of the electrode, after forming the tapered and vertical portions.

11. A semiconductor device, comprising:
a material layer including a tapered portion and a vertical portion,
wherein the tapered portion is formed from a first surface of the material layer toward an inside of the material layer and includes a scalloping-forming trench, and
the vertical portion is formed under the tapered portion in the material layer and includes a plurality of scalloping-forming trenches,
wherein the scalloping-forming trench of the tapered portion has a sectional area $S_{(n)}$ (n: an integer of 1 or greater) of a section perpendicular to a thickness direction of the material layer, the $S_{(n)}$ being changed inward in the thickness direction and having a maximum value $S_{(n)max}$ (n: an integer of 1 or greater) of the $S_{(n)}$,
wherein each of the scalloping-forming trenches of the vertical portion have a sectional area $S'_{(a)}$ (a: an integer of 1 or greater) of a section perpendicular to the thickness direction of the material layer, the $S'_{(a)}$ being changed inward in the thickness direction, and a maximum value $S'_{(a)max}$ (a: an integer of 1 or greater) of the $S'_{(a)}$ of each scalloping-forming trench of the vertical portion is a constant value, and wherein $S'_{(a)max}$ is smaller than any $S_{(n)max}$.

12. The semiconductor device according to the above 11, wherein the tapered portion includes two or more scalloping-forming trenches, the $S_{(n)max}$ of each scalloping-forming trench of the tapered portion is gradually decreased from the first surface of the material layer inward the thickness direction thereof, and the $S_{(n)max}$ of the lowermost scalloping-forming trench of the tapered portion farthest from the first surface of the material layer in the thickness direction thereof is greater than the $S'_{(a)max}$.

13. The semiconductor device according to the above 11 or 12, wherein the material layer includes an electrode formed so as to penetrate through the material layer in the thickness direction thereof, the tapered portion and the vertical portion conencting with each other penetrate through the material layer in the thickness direction thereof, an insulation film is filled up in the tapered portion and the vertical portion, the insulation film filled up in the tapered portion and the vertical portion is an insulation ring, and the insulation ring is formed so as to penetrate through the material layer and so as to surround an outer side surface of the electrode.

14. A data processing device including a plurality of the semiconductor devices according to the above 13, wherein each semiconductor device is connected to each other via the electrode, the data processing device further comprises a calculation processing device, and the calculation processing device is connected to each semiconductor device via a system bus.

15. The data processing device according to the above 14, wherein each semiconductor device is a semiconductor chip that can perform a storage operation as a DRAM.

The invention claimed is:

1. A semiconductor device, comprising:
a material layer including a first surface and a trench with an opening in the first surface, a tapered portion, and a vertical portion,
wherein the tapered portion is in contact with the opening,
wherein the vertical portion has a substantially vertical sidewall, and
wherein at least one of the tapered portion and the vertical portion comprises two or more scalloping-forming trenches.

2. The semiconductor device according to claim 1, wherein the tapered portion comprises the two or more scalloping-forming trenches, and the width of the scalloping-forming trench close to the opening is larger than the width of the scalloping-forming trench far from the opening.

3. The semiconductor device according to claim 1, wherein the vertical portion comprises the two or more scalloping-forming trenches, the scalloping-forming trenches having substantially the same widths.

4. The semiconductor device according to claim 1, wherein an edge of a scalloping-forming sidewall of each of the two or more scalloping-forming trenches has a smooth surface without an acute peak.

5. The semiconductor device according to claim 1, wherein the two or more scalloping-forming trenches penetrate into a semiconductor substrate.

6. The semiconductor device according to claim 1, wherein the two or more scalloping-forming trenches are filled with a conductive material.

7. The semiconductor device according to claim 1, wherein the two or more scalloping-forming trenches are filled with an insulation material.

8. The semiconductor device according to claim 1, wherein the two or more scalloping-forming trenches surround a through silicon via penetrating through a semiconductor substrate, and form an insulation ring.

9. The semiconductor device according to claim 8, wherein the semiconductor device comprises a plurality of the semiconductor substrates, each of the semiconductor substrates including the through silicon via and the insulation ring, and
the plurality of the semiconductor substrates are stacked, and
the plurality of the semiconductor substrates are electrically connected with each other via the through silicon vias.

10. A method for manufacturing a semiconductor device, comprising:
forming a tapered portion from a first surface of a material layer inward in a thickness direction thereof; and
forming a vertical portion having a substantially vertical sidewall under the tapered portion in the material layer,
wherein at least one of the tapered portion and the vertical portion comprises two or more scalloping-forming trenches.

11. The method for manufacturing a semiconductor device according to claim 10, wherein the tapered portion comprises the two or more scalloping-forming trenches, and the width of the scalloping-forming trench close to the first surface is larger than the width of the scalloping-forming trench far from the first surface.

12. The method for manufacturing a semiconductor device according to claim 10, wherein the vertical portion comprises the two or more scalloping-forming trenches, the scalloping-forming trenches having substantially the same widths.

13. The method for manufacturing a semiconductor device according to claim 10, wherein one of the two or more scalloping-forming trenches is formed by performing one cycle, the cycle including following steps (1) to (3):
(1) isotropically etching the exposed material layer to form a second of the two or more scalloping-forming trenches;
(2) forming a protective film on an inner wall of the second trench; and
(3) removing the protective film formed on a bottom surface of the inner wall of the second trench.

14. The method for manufacturing a semiconductor device according to claim 13, further comprising performing a plurality of said one cycle wherein in forming the tapered portion, an etching time of the step (1) is shortened every one cycle.

15. The method for manufacturing a semiconductor device according to claim 13, wherein the material layer is a semiconductor substrate made of silicon, and in the step (1), $SF_6$ gas is used.

16. The method for manufacturing a semiconductor device according to claim 13, wherein the protective film contains a polymer including carbon as a main component, and in the step (2), $C_4F_8$ gas is used.

17. The method for manufacturing a semiconductor device according to claim 13, wherein the method further comprises, after forming the tapered portion and the vertical portion:
 removing the protective film on the inner wall of the second trench; and
 rounding an edge of a scallop-forming sidewall.

18. The method for manufacturing a semiconductor device according to claim 17, wherein in rounding the edge of the scallop-forming sidewall, an isotropic etching is performed.

19. The method for manufacturing a semiconductor device according to claim 17, wherein the rounding the edge of the scallop-forming sidewall comprises:
 forming a second material layer; and
 etching the edge of the scallop-forming sidewall.

20. A data processing device, comprising:
 a processor;
 a DRAM memory module; and
 a system bus connecting the processor with the DRAM memory module;
 wherein a semiconductor device included in the data processing device comprises a material layer including a first surface and a trench with an opening in the first surface, a tapered portion, and a vertical portion,
 wherein the tapered portion is in contact with the opening and comprises a scalloping-forming trench; and
 the vertical portion has a substantially vertical sidewall, and
 a width of the scalloping-forming trench of the tapered portion is larger than a width of the vertical portion.

* * * * *